(12) United States Patent
Alves et al.

(10) Patent No.: US 8,549,378 B2
(45) Date of Patent: Oct. 1, 2013

(54) RAIM SYSTEM USING DECODING OF VIRTUAL ECC

(75) Inventors: Luiz C. Alves, Hopewell Junction, NY (US); Luis A. Lastras-Montano, Cortlandt Manor, NY (US); Patrick J. Meaney, Poughkeepsie, NY (US); Eldee Stephens, Waterbury, CT (US); Barry M. Trager, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 427 days.

(21) Appl. No.: 12/822,469

(22) Filed: Jun. 24, 2010

(65) Prior Publication Data

US 2011/0320918 A1    Dec. 29, 2011

(51) Int. Cl.
G11C 29/00    (2006.01)

(52) U.S. Cl.
USPC ........... 714/763; 714/785; 714/770; 714/800; 714/804; 714/807; 714/6.22; 714/6.24; 714/25; 714/42; 714/48; 711/154; 711/114

(58) Field of Classification Search
None
See application file for complete search history.

(56) References Cited

U.S. PATENT DOCUMENTS

| 4,464,747 A | 8/1984 | Groudan et al. |
| 4,817,091 A | 3/1989 | Katzman et al. |
| 4,996,687 A | 2/1991 | Hess et al. |
| 5,124,948 A | 6/1992 | Takizawa et al. |
| 5,163,023 A | 11/1992 | Ferris et al. |
| 5,272,671 A | 12/1993 | Kudo |
| 5,463,643 A | 10/1995 | Gaskins |
| 5,488,691 A | 1/1996 | Fuoco |
| 5,499,253 A | 3/1996 | Lary |
| 5,513,135 A | 4/1996 | Dell et al. |
| 5,537,665 A | 7/1996 | Patel et al. |
| 5,574,945 A | 11/1996 | Elko et al. |
| 5,655,076 A | 8/1997 | Kimura et al. |
| 5,680,564 A | 10/1997 | Divivier |
| 5,684,810 A | 11/1997 | Nakamura et al. |
| 6,012,839 A | 1/2000 | Nguyen |
| 6,125,469 A | 9/2000 | Zook et al. |
| 6,131,178 A | 10/2000 | Fujita et al. |

(Continued)

FOREIGN PATENT DOCUMENTS

| JP | 11144491 A2 | 5/1999 |
| WO | 2006029243 A1 | 3/2006 |
| WO | WO 2006/029243 * | 3/2006 |

OTHER PUBLICATIONS

D. Wortzman; "Two-Tier Error Correcting Code for Memories"; vol. 26, #10, pp. 5314-5318; Mar. 1984.

(Continued)

*Primary Examiner* — John Trimmings
(74) *Attorney, Agent, or Firm* — Cantor Colburn LLP

(57) ABSTRACT

Error correction and detection in a redundant memory system including a a computer implemented method that includes receiving data including error correction code (ECC) bits, the receiving from a plurality of channels, each channel comprising a plurality of memory devices at memory device locations. The method also includes computing syndromes of the data; receiving a channel identifier of one of the channels; and removing a contribution of data received on the channel from the computed syndromes, the removing resulting in channel adjusted syndromes. The channel adjusted syndromes are decoded resulting in channel adjusted memory device locations of failing memory devices, the channel adjusted memory device locations corresponding to memory device locations.

21 Claims, 9 Drawing Sheets

(56) References Cited

U.S. PATENT DOCUMENTS

| | | | |
|---|---|---|---|
| 6,332,206 B1 | 12/2001 | Nakatsuji et al. | |
| 6,381,685 B2 | 4/2002 | Dell et al. | |
| 6,418,068 B1 | 7/2002 | Raynham | |
| 6,442,726 B1 | 8/2002 | Knefel | |
| 6,715,116 B2 | 3/2004 | Lester et al. | |
| 6,763,444 B2 | 7/2004 | Thomann | |
| 6,820,072 B1 | 11/2004 | Skaanning et al. | |
| 6,845,472 B2 | 1/2005 | Walker | |
| 6,854,070 B2 | 2/2005 | Johnson et al. | |
| 6,973,612 B1 | 12/2005 | Rodi | |
| 6,976,194 B2 | 12/2005 | Cypher | |
| 6,981,205 B2 | 12/2005 | Fukushima et al. | |
| 6,988,219 B2 | 1/2006 | Hitz et al. | |
| 7,055,054 B2 | 5/2006 | Olarig | |
| 7,099,994 B2 | 8/2006 | Thayer et al. | |
| 7,149,269 B2 | 12/2006 | Cranford, Jr. et al. | |
| 7,149,945 B2 | 12/2006 | Brueggen | |
| 7,191,257 B2 | 3/2007 | Ali Khan et al. | |
| 7,200,780 B2 | 4/2007 | Kushida | |
| 7,278,086 B2 | 10/2007 | Banks et al. | |
| 7,313,749 B2 | 12/2007 | Nerl et al. | |
| 7,320,086 B2 | 1/2008 | Majni et al. | |
| 7,353,316 B2 | 4/2008 | Erdmann | |
| 7,409,581 B2 | 8/2008 | Santeler et al. | |
| 7,467,126 B2 | 12/2008 | Smith et al. | |
| 7,484,138 B2 | 1/2009 | Hsieh et al. | |
| 7,752,490 B2 | 7/2010 | Abe | |
| 8,041,990 B2* | 10/2011 | O'Connor et al. | 714/6.22 |
| 8,046,628 B2 | 10/2011 | Resnick | |
| 2002/0181633 A1 | 12/2002 | Trans | |
| 2003/0002358 A1 | 1/2003 | Lee et al. | |
| 2003/0023930 A1 | 1/2003 | Fujiwara et al. | |
| 2003/0208704 A1 | 11/2003 | Bartels et al. | |
| 2004/0034818 A1 | 2/2004 | Gross et al. | |
| 2004/0093472 A1 | 5/2004 | Dahlen et al. | |
| 2004/0123223 A1 | 6/2004 | Halford | |
| 2004/0168101 A1 | 8/2004 | Kubo | |
| 2004/0227946 A1 | 11/2004 | Li et al. | |
| 2005/0108594 A1 | 5/2005 | Menon et al. | |
| 2005/0204264 A1 | 9/2005 | Yusa | |
| 2006/0156190 A1* | 7/2006 | Finkelstein et al. | 714/763 |
| 2006/0244827 A1 | 11/2006 | Moya | |
| 2006/0248406 A1 | 11/2006 | Qing et al. | |
| 2006/0282745 A1 | 12/2006 | Joseph et al. | |
| 2007/0011562 A1 | 1/2007 | Alexander et al. | |
| 2007/0033195 A1 | 2/2007 | Stange et al. | |
| 2007/0047344 A1 | 3/2007 | Thayer et al. | |
| 2007/0047436 A1 | 3/2007 | Arai et al. | |
| 2007/0050688 A1 | 3/2007 | Thayer | |
| 2007/0089035 A1 | 4/2007 | Alexander et al. | |
| 2007/0101094 A1 | 5/2007 | Thayer et al. | |
| 2007/0150792 A1* | 6/2007 | Ruckerbauer | 714/763 |
| 2007/0192667 A1 | 8/2007 | Nieto et al. | |
| 2007/0201595 A1 | 8/2007 | Stimple et al. | |
| 2007/0217559 A1 | 9/2007 | Stott et al. | |
| 2007/0260623 A1 | 11/2007 | Jaquette et al. | |
| 2007/0286199 A1 | 12/2007 | Coteus et al. | |
| 2008/0005644 A1 | 1/2008 | Dell | |
| 2008/0010435 A1 | 1/2008 | Smith et al. | |
| 2008/0046792 A1 | 2/2008 | Yamamoto et al. | |
| 2008/0046796 A1 | 2/2008 | Dell et al. | |
| 2008/0163385 A1 | 7/2008 | Mahmoud | |
| 2008/0168329 A1 | 7/2008 | Han | |
| 2008/0222449 A1 | 9/2008 | Ramgarajan et al. | |
| 2008/0250270 A1 | 10/2008 | Bennett | |
| 2008/0266999 A1 | 10/2008 | Thayer | |
| 2008/0285449 A1 | 11/2008 | Larsson et al. | |
| 2008/0313241 A1 | 12/2008 | Li et al. | |
| 2009/0006886 A1 | 1/2009 | O'Connor | |
| 2009/0006900 A1 | 1/2009 | Lastras-Montano | |
| 2009/0024902 A1* | 1/2009 | Jo et al. | 714/763 |
| 2009/0049365 A1 | 2/2009 | Kim et al. | |
| 2009/0106491 A1 | 4/2009 | Piszczek et al. | |
| 2009/0164715 A1 | 6/2009 | Astigarraga et al. | |
| 2009/0193315 A1 | 7/2009 | Gower et al. | |
| 2009/0228648 A1 | 9/2009 | Wack | |
| 2009/0287890 A1 | 11/2009 | Bolosky | |
| 2010/0005281 A1 | 1/2010 | Buchmann et al. | |
| 2010/0005345 A1 | 1/2010 | Ferraiolo et al. | |
| 2010/0082066 A1 | 4/2010 | Biyani | |
| 2010/0107148 A1 | 4/2010 | Decker et al. | |
| 2010/0162033 A1 | 6/2010 | Ahn et al. | |
| 2010/0205367 A1 | 8/2010 | Ehrlich et al. | |
| 2010/0241899 A1 | 9/2010 | Mayer et al. | |
| 2010/0293532 A1 | 11/2010 | Andrade et al. | |
| 2010/0306489 A1 | 12/2010 | Abts et al. | |
| 2010/0306574 A1 | 12/2010 | Suzuki et al. | |
| 2011/0051854 A1* | 3/2011 | Kizer et al. | 375/340 |
| 2011/0075782 A1 | 3/2011 | Zhang et al. | |
| 2011/0078496 A1* | 3/2011 | Jeddeloh | 714/6.24 |
| 2011/0126079 A1* | 5/2011 | Wu et al. | 714/763 |
| 2011/0173162 A1 | 7/2011 | Anderson et al. | |
| 2011/0320869 A1 | 12/2011 | Gower et al. | |
| 2011/0320881 A1 | 12/2011 | Dodson et al. | |
| 2011/0320914 A1 | 12/2011 | Alves et al. | |

OTHER PUBLICATIONS

The RAIDBook—A Source Book for RAID Technology by the RAID Advisory Board; Lino Lakes; MN; Jun. 9, 1993; XP002928115.

L.A. Lastras-Montano; "A new class of array codes for memory storage"; Version—Jan. 19, 2011.

System Z GF (65536) x8 RAIM Code—Mar. 12, 2010, pp. 1-22.

Chen, P. M., et al.; "RAID: High Performance, Reliable Secondary Storage"; ACM Computing Surveys; ACM, New York, NY, US vol. 26, No. 2, Jun. 1, 1994, pp. 145-185.

EP Application No. 08760760.2 Examination Report dated Jun. 10, 2010, 7 pages.

EP Application No. 08760760.2 Examination Report dated Jul. 23, 2012, 7 pages.

International Search Report and Written Opinion for PCT/EP2008/057199 dated Mar. 23, 2009, 10 pages.

International Search Report and Written Opinion for PCT/EP2011/058924 dated Nov. 9, 2011, 9 pages.

* cited by examiner

| MARKING STATE | CHIP MARK X | CHIP MARK Y | CHANNEL MARK |
|---|---|---|---|
| A | | | |
| B | ✓ | | |
| C | ✓ | ✓ | |
| D | | | ✓ |
| E | ✓ | | ✓ |
| F | ✓ | ✓ | ✓ |

*FIG. 2*

| MARKING STATE | CHIP MARK X | CHIP MARK Y | CHANNEL MARK | NO NEW ERROR | NEW SINGLE BIT ERROR | NEW DOUBLE BIT ERROR (SEPARATE CHIPS) | NEW SINGLE CHIP ERROR (NOT SINGLE BIT) | NEW DOUBLE ERROR (NOT DOUBLE BIT) | NEW CHANNEL ERROR |
|---|---|---|---|---|---|---|---|---|---|
| A |  |  |  | CLEAN | CE | UE | CE | UE | CE(*) |
| B | ✓ |  |  | CLEAN | CE | UE | CE | UE | CE(*) |
| C |  | ✓ |  | CLEAN | CE | UE | CE | UE | CE(*) |
| D |  |  | ✓ | CLEAN | CE | UE | CE | UE | UE(**) |
| E | ✓ |  | ✓ | CLEAN | CE | UE | CE | UE | UE(**) |
| F | ✓ | ✓ | ✓ | CLEAN | CE | UE | UE | UE() | UE() |

FIG. 3

| MARKING STATE | CHIP MARK X | CHIP MARK Y | CHANNEL MARK | NO NEW ERROR | NEW SINGLE BIT ERROR CHANNELS {0-3}/4 | NEW SINGLE CHIP ERROR (NOT SINGLE BIT) CHANNELS {0-3}/4 |
|---|---|---|---|---|---|---|
| A |  |  |  | SPUE | UE/SPUE | UE/SPUE |
| B | ✓ |  |  | SPUE | UE/SPUE | UE/SPUE |
| C | ✓ | ✓ |  | SPUE | UE/SPUE | UE/SPUE |
| D |  |  | ✓ | SPUE | UE | UE |
| E | ✓ |  | ✓ | SPUE | UE | UE |
| F | ✓ | ✓ | ✓ | SPUE | UE | UE(*) |

*FIG. 4*

| VALID LOCATION | NEW VALUE FOR $e_x$ | NEW VALUE FOR $e_y$ |
|---|---|---|
| $r \leftarrow r$ | $e_x \leftarrow e_x$ | $e_y \leftarrow e_y$ |
| $r \leftarrow r \oplus x_{(-j*)}$ | $e_x \leftarrow e_x \oplus x_{(-j*)}$ | $e_y \leftarrow e_y$ |
| $r \leftarrow r \oplus y_{(-j*)}$ | $e_x \leftarrow e_x$ | $e_y \leftarrow e_y \oplus y_{(-j*)}$ |
| $r \leftarrow r \oplus x_{(-j*)} \oplus y_{(-j*)}$ | $e_x \leftarrow e_x \oplus x_{(-j*)}$ | $e_y \leftarrow e_y \oplus y_{(-j*)}$ |

TABLE IV

*FIG. 7*

| CHANNEL (k) | CHIP (j) | $X_{k,j}(b_0 b_1 ... b_{15})$ | CHECK (●) DATA (○) |
|---|---|---|---|
| 0 | 0 | 1000000000000000 | ● |
| 0 | 1 | 1000001011000011 | ○ |
| 0 | 2 | 1000110010101111 | ○ |
| 0 | 3 | 1000001111110001 | ○ |
| 0 | 4 | 1000110110010011 | ○ |
| 0 | 5 | 1000101001000101 | ○ |
| 0 | 6 | 1000010100011111 | ○ |
| 0 | 7 | 1000111001101000 | ○ |
| 0 | 8 | 1000011111010001 | ○ |
| 1 | 0 | 0100000000000000 | ● |
| 1 | 1 | 0100000101101101 | ○ |
| 1 | 2 | 0100110001011011 | ○ |
| 1 | 3 | 0100110110111100 | ○ |
| 1 | 4 | 0100101010001101 | ○ |
| 1 | 5 | 0100010100101110 | ○ |
| 1 | 6 | 0100111011001011 | ○ |
| 1 | 7 | 0100011100110100 | ○ |
| 1 | 8 | 0100111110101100 | ○ |
| 2 | 0 | 0010000000000000 | ● |
| 2 | 1 | 0010110000111010 | ○ |
| 2 | 2 | 0010001111101001 | ○ |
| 2 | 3 | 0010101010010110 | ○ |
| 2 | 4 | 0010010101001010 | ○ |
| 2 | 5 | 0010111000010111 | ○ |
| 2 | 6 | 0010011101101001 | ○ |
| 2 | 7 | 0010111111010010 | ○ |
| 2 | 8 | 0010101101010110 | ○ |
| 3 | 0 | 0001000000000000 | ● |
| 3 | 1 | 0001011011010101 | ○ |
| 3 | 2 | 0001110101111000 | ○ |
| 3 | 3 | 0001010110000011 | ○ |
| 3 | 4 | 0001111000100101 | ○ |
| 3 | 5 | 0001011111001111 | ○ |
| 3 | 6 | 0001111100111000 | ○ |
| 3 | 7 | 0001101110100001 | ○ |
| 3 | 8 | 0001100111100011 | ○ |
| 4 | 0 | 1111000000000000 | ● |
| 4 | 1 | 1111100101000001 | ● |
| 4 | 2 | 1111010001100101 | ● |
| 4 | 3 | 1111000101011000 | ● |
| 4 | 4 | 1111110001110001 | ● |
| 4 | 5 | 1111011010110011 | ● |
| 4 | 6 | 1111001110000101 | ● |
| 4 | 7 | 1111110100101111 | ● |
| 4 | 8 | 1111101011001000 | ● |

TABLE V

RAIM SYSTEM USING DECODING OF VIRTUAL ECC

BACKGROUND

This invention relates generally to computer memory and more particularly, to error detection and correction in a redundant memory system.

Memory device densities have continued to grow as computer systems have become more powerful. With the increase in density comes an increased probability of encountering a memory failure during normal system operations. Techniques to detect and correct bit errors have evolved into an elaborate science over the past several decades. Perhaps the most basic detection technique is the generation of odd or even parity where the number of 1's or 0's in a data word are "exclusive or-ed" (XOR-ed) together to produce a parity bit. If there is a single error present in the data word during a read operation, it can be detected by regenerating parity from the data and then checking to see that it matches the stored (originally generated) parity.

Richard Hamming recognized that the parity technique could be extended to not only detect errors, but to also correct errors by appending an XOR field, an error correction code (ECC) field, to each data, or code, word. The ECC field is a combination of different bits in the word XOR-ed together so that some number of errors can be detected, pinpointed, and corrected. The number of errors that can be detected, pinpointed, and corrected is related to the length of the ECC field appended to the data word. ECC techniques have been used to improve availability of storage systems by correcting memory device (e.g., dynamic random access memory or "DRAM") failures so that customers do not experience data loss or data integrity issues due to failure of a memory device.

Redundant array of independent memory (RAIM) systems have been developed to improve performance and/or to increase the availability of storage systems. RAIM distributes data across several independent memory modules (each memory module contains one or more memory devices). There are many different RAIM schemes that have been developed each having different characteristics, and different pros and cons associated with them. Performance, availability, and utilization/efficiency (the percentage of the disks that actually hold customer data) are perhaps the most important. The tradeoffs associated with various schemes have to be carefully considered because improvements in one attribute can often result in reductions in another.

SUMMARY

An embodiment is a computer implemented method that includes receiving data including error correction code (ECC) bits, the receiving from a plurality of channels, each channel comprising a plurality of memory devices at memory device locations. The method also includes computing syndromes of the data; receiving a channel identifier of one of the channels; and removing a contribution of data received on the channel from the computed syndromes, the removing resulting in channel adjusted syndromes. The channel adjusted syndromes are decoded resulting in channel adjusted memory device locations of failing memory devices, the channel adjusted memory device locations corresponding to memory device locations.

Another embodiment is a system that includes a plurality of channels, each channel including a plurality of memory devices at memory device locations; and a decoder in communication with the channels, the decoder configured for performing a method. The method includes method that includes receiving data including ECC bits, the receiving from the channels. The method also includes computing syndromes of the data; receiving a channel identifier of one of the channels; and removing a contribution of data received on the channel from the computed syndromes, the removing resulting in channel adjusted syndromes. The channel adjusted syndromes are decoded resulting in channel adjusted memory device locations of failing memory devices, the channel adjusted memory device locations corresponding to memory device locations.

A further embodiment is a computer program product including a tangible storage medium readable by a processing circuit and storing instructions for execution by the processing circuit for performing a method. The method includes receiving data including ECC bits, the receiving from a plurality of channels, each channel comprising a plurality of memory devices at memory device locations. The method also includes computing syndromes of the data; receiving a channel identifier of one of the channels; and removing a contribution of data received on the channel from the computed syndromes, the removing resulting in channel adjusted syndromes. The channel adjusted syndromes are decoded resulting in channel adjusted memory device locations of failing memory devices, the channel adjusted memory device locations corresponding to memory device locations.

BRIEF DESCRIPTION OF THE SEVERAL VIEWS OF THE DRAWINGS

Referring now to the drawings wherein like elements are numbered alike in the several FIGURES:

FIG. 2 depicts a table that defines the marking states for a RAIM code in accordance with an embodiment;

FIG. 3 depicts a table that summarizes the capabilities of the RAIM code in accordance with an embodiment;

FIG. 4 depicts a table that summarizes the capabilities of the RAIM code in the presence of an injected SPUE in accordance with an embodiment;

FIG. 7 depicts a table that summaries updates that need to be performed to various variables according an exemplary embodiments;

FIG. 8 depicts a table that includes a binary pattern corresponding to each symbol in an embodiment of the RAIM code; and FIG. 9 depicts an error control code symbol definition according to an embodiment.

DETAILED DESCRIPTION

An embodiment provides an implementation efficient error control coding system that allows a memory to sustain a combination of known memory device failures, a channel failure, as well as additional corrections. An embodiment of an algorithm described herein is able to detect and correct a failing channel even in the presence of known chip failures without any external aid to locate the failing channel. An embodiment provides a general framework for the design of a new class of efficient coding algorithms that may be applied to a variety of memory system architectures. An embodiment described herein provides lower complexity of implementation, a more regular placement for redundant checks throughout a channel, and no loss of strength in error correction and detection coverage as compared to Reed-Solomon codes.

As in many redundant array of independent memory (RAIM) system designs, an embodiment assumes that one channel stores the simple parity of the other channels, thus enabling a simple way of correcting for many errors. Embodiments described herein are concerned with the check bits that are stored in the other channels and how to design these check bits. In an embodiment, these check bits are designed to solve the problem of "error mirroring" which is the phenomenon that errors outsides a failing channel get replicated into the failing channel when a simple "exclusive or" (XOR) operation is used to correct the failing channel, thus increasing the apparent number of errors in the pattern.

An embodiment described herein provides techniques for developing parity check matrices, as well as very efficient encoding and decoding algorithms for codes that have no loss of strength with respect to Reed-Solomon codes, yet preserve the simple parity across the channels and gracefully handle the problem of error mirroring.

As used herein, the term "memory channel" refers to a logical entity that is attached to a memory controller and which connects and communicates to registers, memory buffers and memory devices. Thus, for example, in a cascaded memory module configuration a memory channel would comprise the connection means from a memory controller to a first memory module, the connection means from the first memory module to a second memory module, and all intermediate memory buffers, etc. As used herein, the term "channel failure" refers to any event that can result in corrupted data appearing in the interface of a memory controller to the memory channel. This failure could be, for example, in a communication bus (e.g., electrical, and optical) or in a device that is used as an intermediate medium for buffering data to be conveyed from memory devices through a communication bus, such as a memory hub device.

Figure 1:
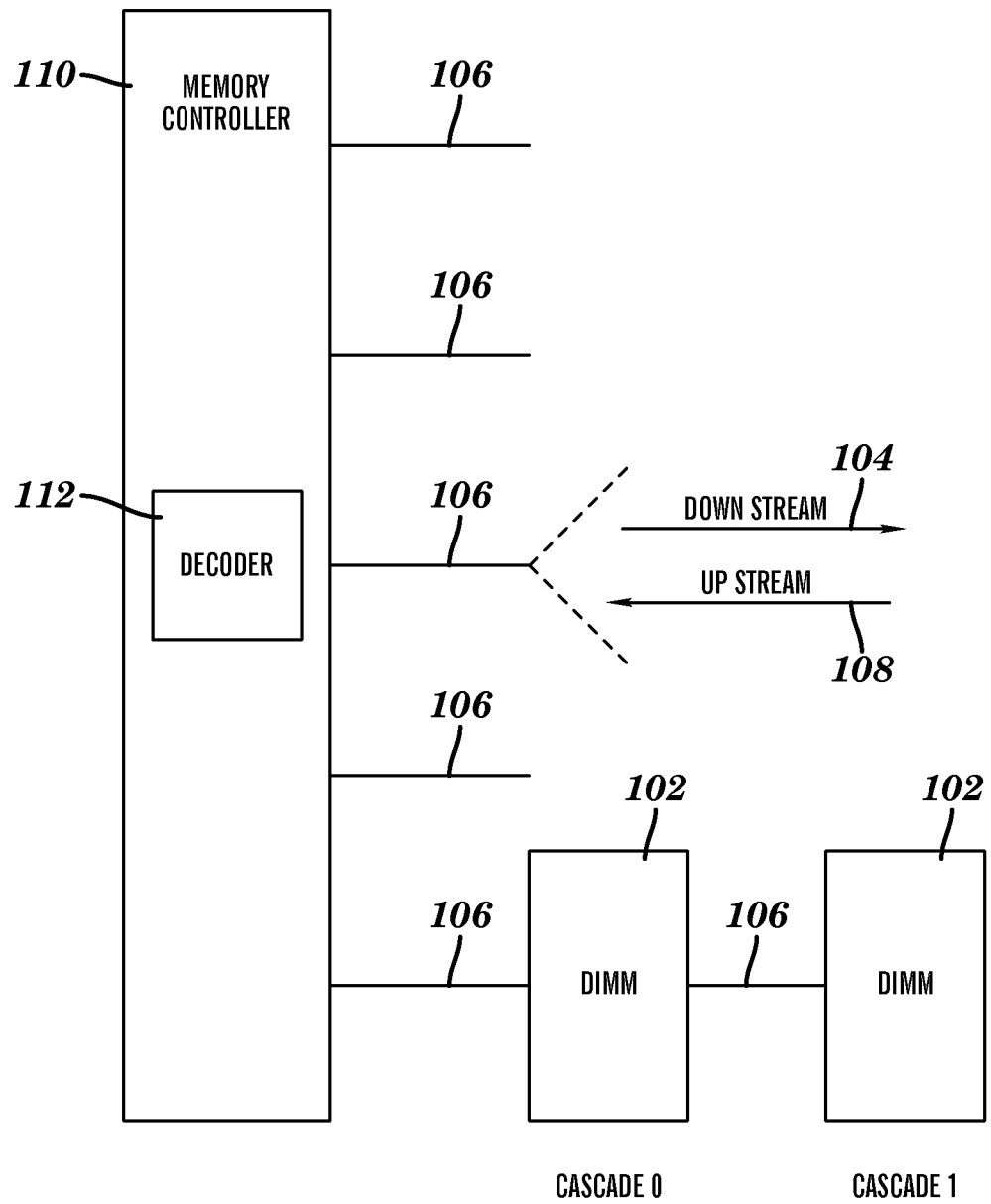
FIG. 1 is a block diagram of a cascaded interconnect memory system that may be implemented by an exemplary embodiment.

FIG. 1 is a block diagram of a cascade interconnect memory system that may be implemented by an exemplary embodiment. The memory system depicted in FIG. 1 includes, multiple independent cascade interconnected memory interface busses 106 that are logically aggregated together to operate in unison to support a single independent access request from a memory controller 110. The servicing of the single independent access request includes data and error detection/correction information distributed or "striped" across the parallel memory interface busses 106 and associated memory devices located on the memory modules 102.

As shown in the embodiment depicted in FIG. 1, the memory controller 110 attaches to five narrow/high speed point-to-point memory interface busses 106, with each memory interface bus 106 connecting one of five memory controller interface channels to a cascade interconnect memory module 102 (or memory subsystem). In an exemplary embodiment, each memory module 102 includes at least one hub device and one or more memory devices. As used herein, the terms "memory device" and "chip" are used interchangeably with a chip being a particular implementation of a memory device. As depicted in FIG. 1, the memory interface busses 106 operate in unison to support an access request from the memory controller 110. In an exemplary embodiment, there may exist a multiplicity of outstanding fetch and store requests to the multiple cascades in the memory subsystem.

Each memory interface bus 106 in the embodiment depicted in FIG. 1 includes an upstream bus 108 and a downstream bus 104. One of the functions provided by the memory modules 102 (e.g., a hub device located on the memory module 102) is a re-drive function to send signals on the upstream bus 108 to the memory controller 110 or on the downstream bus 104 to other memory modules 102. In an exemplary embodiment, up to two memory modules 102 are cascade connected to each memory interface bus 106. In an exemplary embodiment, the memory interface bus 106 is implemented using differential clock and data signals (i.e., each clock and data signal requires two wires). In an exemplary embodiment, the downstream bus 104 includes thirty-two wires to support: one clock signal, thirteen data/command signals (or bits), one spare clock lane, and one spare data/command lane. In this embodiment, each data packet is transferred over the downstream bus 104 in twelve beats. In an exemplary embodiment, the upstream bus 108 includes forty-six wires to support: one clock signal, twenty data/command signals, one spare clock lane, and one spare data/command lane. In this embodiment, each data packet is transferred over the upstream bus 108 in eight beats.

As used herein, the term "RAIM" refers to redundant arrays of independent memory modules (e.g., dual in-line memory modules or "DIMMs). In a RAIM system, if one of the memory channels fails (e.g, a memory module in the channel), the redundancy allows the memory system to use data from one or more of the other memory channels to reconstruct the data stored on the memory module(s) in the failing channel. The reconstruction is also referred to as error correction. As used herein, the terms "RAIM" and "redundant arrays of independent disk" or "RAID" are used interchangeably.

In an exemplary embodiment, the memory system depicted in FIG. 1 is a RAIM memory system and the five channels are lock step channels (i.e., the five memory interface busses 106 are accessed in unison with each other). In an exemplary embodiment, the RAIM system depicted in FIG. 1 is implemented using the RAIM ECC code described herein which has the property that one of the channel's data is the bitwise XOR of the other four channel's data with additional check bits included in order to correct for additional errors. In the embodiment depicted in FIG. 1, the decoder 112 is located on the memory controller 110. In embodiments, the decoder 112 is located on the memory modules 102, the memory controller and/or on other hardware/software locations in the memory system.

As used herein, the term "mark" refers to is an indication given to an ECC that a particular symbol or set of symbols of a read word are suspected to be faulty. The ECC can then use this information to enhance its error correction properties. As used herein, the term "correctable error" or "CE" refers to an error that can be corrected while the system is operational, and thus a CE does not cause a system outage. As used herein, the term "uncorrectable error" or "UE" refers to an error that cannot be corrected while the memory system is operational, and thus correction of a UE causes the memory system to be off-line for some period of time while the cause of the UE is being corrected (e.g., by replacing a memory device, by replacing a memory module, recalibrating and interface).

As used herein, the term "coincident" refers to the occurrence of two (or more) error patterns or error conditions that overlap each other in time. In one example, a CE occurs and then later in time, before the first CE can be repaired, a second failure occurs. The first and second failure are said to be coincident. Repair times are always greater than zero and the longer the repair time, the more likely it would be to have a second failure occur coincident with the first. Some contemporary systems attempt to handle multiple failing devices by requiring sparing a first device or module. This may require substantially longer repair times than simply using marking, as provided by exemplary embodiments described herein. Before a second failure is identified, exemplary embodiments provide for immediate correction of a memory channel failure using marking, thus allowing an additional correction of a second failure. Once a memory channel failure is identified, an exemplary embodiment provides correction of the memory channel failure, up to two marked additional chips (e.g., memory devices) and a new single bit error. If the system has at most one marked memory device together with the marked channel, then an entire new chip error can be corrected.

The words "memory channel failure" utilized herein, includes failures of the communication medium that conveys the data from the memory modules 102 to the memory controller 110 (i.e., a memory interface bus 106), in addition to possible memory hub devices and registers.

The ECC code described herein supports incorporating a special uncorrectable error (SPUE) signature into an encoded data packet so that in the absence of new errors, and irrespective of the chip and channel marking state and the errors in the marked chips/channel, the SPUE is still detectable as a SPUE. Even if there are a large number of errors on top of the codeword, the data will still be flagged as a UE. This is necessary to protect against UE data that has to be stored to memory to keep soft errors from having that data appear good (i.e. Clean or CE).

FIG. 2 depicts a table that defines the marking states for a RAIM code according to the value of the chip marks (x and y) as well as the channel mark in accordance with an embodiment. A checkmark indicates that the associated mark has a non-default valid value (i.e., the mark is pointing to a chip/channel). The absence of a checkmark indicates that the corresponding mark is pointing to its default value.

FIG. 3 depicts a table that summarizes the capabilities of an embodiment of the RAIM code as a function of the marking state. A '(*)' indicates that the channel error is correctable in all but about 1 $e^{-9}$ of the cases. A '(**)' indicates that the UE flag is raised with extremely high probability.

FIG. 4 depicts a table that summarizes the capabilities of an embodiment of the RAIM code in the presence of an injected SPUE. A '(*)' indicates that the UE flag is raised with extremely high probability.

A description of a decoder implemented in accordance with an embodiment follows.

Regular syndrome generation stage. There two distinct kinds of syndromes that are associated with an embodiment of a code. One is called the Z syndrome which is obtained by doing a simple XOR of the contents of the five channels:

$Z = D_0 \oplus D_1 \oplus D_2 \oplus D_3 \oplus D_4$

The other syndrome is called S, and is associated with a parity check matrix:

$H = [H_0 H_1 H_2 H_3 H_4]$ $S = H_0 D_0 \oplus H_1 D_1 \oplus H_2 D_2 \oplus H_3 D_3 \oplus H_4 D_4$ This parity check matrix is highly structured and thus the computation of S admits efficient implementations, as described herein below. In an embodiment, the quantity S is a total of 64 bits, logically grouped in four 16-bit ($2^{16}$) Galois Field (GF) elements.

Channel adjusted syndrome generation stage. In an embodiment, the decoder initially computes five syndromes $\{S^{(-0)}, S^{(-1)}, S^{(-2)}, S^{(-3)}, S^{(-4)}\}$ called the "channel adjusted syndromes". Mathematically, $S^{(-i)}$ are the syndromes that would be obtained if the contents of channel i were replaced with the XOR of the contents of the other four channels. The original syndrome S is 64 bits, and the same is true for $S^{(-i)}$, $i \in \{0, 1, 2, 3, 4\}$. Since the contents of the ith channel are $D_i$ and $Z = D_0 \oplus D_1 \oplus D_2 \oplus D_3 \oplus D_4$, the adjusted content for $D_i$ can be computed as $D_i \oplus Z$.

Thus, mathematically, the definition of an embodiment of $S^{(-i)}$ is as follows:

$$S^{(-i)} = H_0 D_0 \oplus H_1 D_1 \oplus H_2 D_2 \oplus H_3 D_3 \oplus H_4 D_4 \oplus H_i Z$$
$$= S \oplus H_i Z$$

It is important to note that channel adjusted syndromes are computed for all channels $i \in \{0, 1, 2, 3, 4\}$. A primary reason behind the design of an embodiment is to be able to have a total latency for the decoder that is constant across all possible error pattern instances. In particular, in this manner the decoder is prepared to correct any possible unknown channel failure.

Chip and channel adjusted syndrome generation stage. In an embodiment, this stage is responsible for removing from each of the syndromes computed in the earlier stage the contribution of any possible error that is residing in chip pointed to by x or y. The input signals to the RAIM block x and y (henceforth called the "chip marks") are each in one of two valid generic states: a chip mark can be set to a default location (different for x and y), or can point to a valid chip location. It is allowed for one chip mark to point to its default location and the other one to be pointing to a valid chip location. The default locations are logically thought to be in a sixth (physically non-existing) channel and in chip positions 9 and 10 of the sixth channel, again these locations physically non-existing depicts since in an embodiment a channel has exactly 9 chips associated with it.

Figure 5:
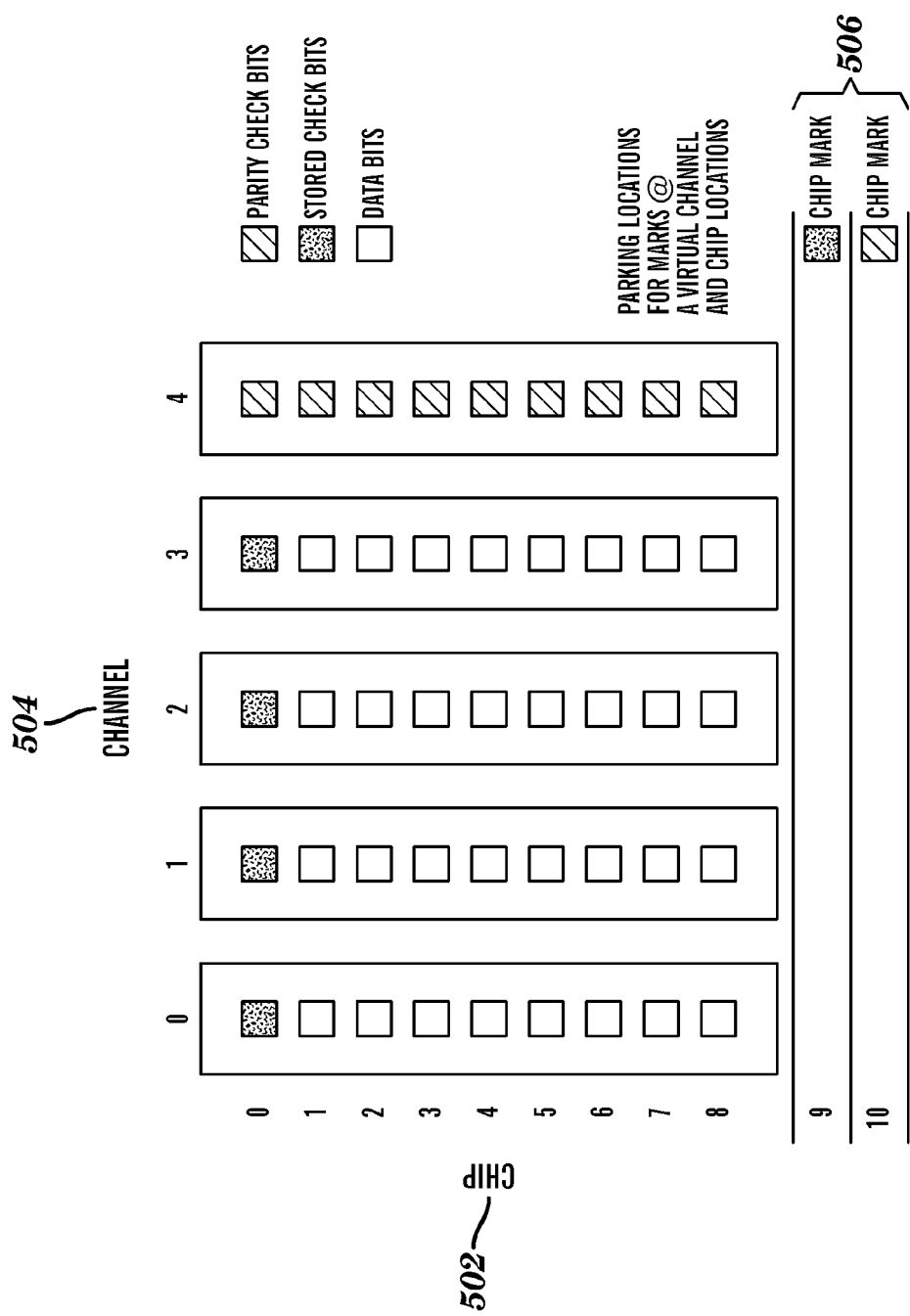
FIG. 5 illustrates an embodiment of the logical placement of symbols of an ECC code.

FIG. 5 illustrates an embodiment of the logical placement of symbols of an error control code in a memory system that includes five channels 504 (e.g., each channel corresponding to a memory module 102) and nine chips 502 (e.g., memory devices). As shown in FIG. 5, four of the channels 504 include stored check bits (e.g., nine sixteen bit symbols) and the fifth channel is the RAIM channel that contains a simple XOR of the other four channels. Also shown in FIG. 5 are the two chip marks 506 which are logically assigned to a sixth (non-existing) channel on non-existing chips nine and ten.

In an embodiment, the decoder is completely symmetric in x and y; that is, it is not necessary to use specifically x or y when there is only one chip being marked. The chip marks may also be thought of as "soft" (unlike the case of chip sparing) since there is no actual data movement/changes when a chip mark is placed, these marks may be removed or changed to another chip with a simple mark store table update (in an embodiment the mark store table is not a component that belongs to the RAIM block). In an embodiment, the decoder always removes any contribution of errors in chips pointed to by x and y even if x and/or y are pointing to a default "parked" location.

The notation used herein is as follows: $\hat{S}^{(-i)}$ denotes the chip and channel adjusted syndromes for the case in which channel i is thought to contain the channel error, and these syndromes are derived from the syndromes $S^{(-i)}$. For each $i \in \{0, 1, 2, 3, 4\}$, contains exactly four 16-bit $GF(2^{16})$ quantities (same number of bits as in S), whereas the chip and channel adjusted syndromes $\{\hat{S}^{(-i)}\}$ are each only two 16-bit quantities. This is explained by the fact that an embodiment always removes potential errors for exactly two chip locations, even if one or two of these locations are pointing to their default value.

An important special case happens when x or y or both happen to point at chip(s) that reside on the same channel that is being adjusted for. The design is such that it is necessary to avoid "double marking" chip locations. Thus, in an embodiment, the following procedure is performed by the decoder: while preparing the chip and channel adjusted syndromes for channel i, it is checked whether x, y or both reside on channel i. Any chip mark pointing to a chip in channel i is "moved" to its default location for the purposes of making computations that assume that channel i is marked. It is important to note that the "movement" of chip marks is independent for each channel; all five possible chip mark movements are calculated and performed in parallel.

One embodiment of this design is that the corrected content of chips that are marked may in fact be corrected through the RAIM channel correction mechanism.

Channel adjusted mark generation. In an embodiment, the externally supplied chip marks x, y need to be suitably modified for each possible choice for channel mark. One reason has been mentioned previously: when a chip mark points to a chip that is contained in a channel that is being marked, this chip mark needs to be moved to its default position. This is not the only reason the chip marks need to be adjusted in a per channel marked basis. The structure of an embodiment of the this RAIM code, which stores a simple parity in the fifth channel of the other four channels, gives rise to a phenomenon that is termed "error mirroring".

This is most easily understood by example. Suppose that the following is received from the five channels:

$$\left( D_0, D_1 \oplus \begin{bmatrix} 0 \\ 0 \\ 0 \\ 0 \\ e \\ 0 \\ 0 \\ 0 \\ 0 \end{bmatrix}, D_2, D_3 \oplus \begin{bmatrix} \epsilon_1 \\ \epsilon_2 \\ \epsilon_3 \\ \epsilon_4 \\ \epsilon_5 \\ \epsilon_6 \\ \epsilon_7 \\ \epsilon_8 \\ \epsilon_9 \end{bmatrix}, D_4 \right)$$

In the above, $D_i$ for the original nine 16-bit symbols stored in channel i for $i \in \{0, 1, 2, 3, 4\}$ (so that $D_4 = D_0 \oplus D_1 \oplus D_2 \oplus D_3$), there is a single chip error in channel one in the fifth chip with an error magnitude e and there is a channel failure in channel three. If channel three is marked accordingly, consider what would be obtained if XOR of channels 0, 1, 2 and 4 is calculated and the result is substituted in channel three:

$$\left( D_0, D_1 \oplus \begin{bmatrix} 0 \\ 0 \\ 0 \\ 0 \\ e \\ 0 \\ 0 \\ 0 \\ 0 \end{bmatrix}, D_2, D_3 \oplus \begin{bmatrix} 0 \\ 0 \\ 0 \\ 0 \\ e \\ 0 \\ 0 \\ 0 \\ 0 \end{bmatrix}, D_4 \right)$$

Note that the chip error with magnitude e has been "mirrored" into channel three, in exactly the same row (chip index within a channel) as the original row (row five in this case). An exemplary embodiment of the decoder Due to reasons that are beyond the scope of this initial high level description of the decoder operation it turns out that the correct method for decoding the remaining error calls for thinking of "channel adjusted chip positions" instead of regular chip positions, and thus chip marks need to be channel adjusted for each channel. Suppose that $X_{k,j}$ is the 16-bit Galois Field pattern that is associated with the chip in channel k, chip j. Then the channel adjusted chip position of $X_{k,j}$ when channel i* is marked is given by $X_{k,j} \oplus X_{i^*,j}$.

Syndrome and mark selector. The architecture of an embodiment of the decoder is such that internally, a channel is always chosen to be marked. The index of this channel that is marked is called i*, which is a number in $\{0, 1, 2, 3, 4\}$. This true even in the case there are no new errors to be solved for or in the case there is no external channel marked. When there is no obvious choice for what channel mark to use, the decoder chooses the fifth channel (i*=4) as the channel mark.

An embodiment of a process followed to do syndrome selection is described next. When an external channel mark is given, the decoder will always multiplex the chip and channel adjusted syndromes corresponding to that channel (it will also multiplex the channel adjusted syndromes for that channel as well, as they are needed for the next stage).

When there is no external channel mark placed, the decoder checks whether there is a unique chip and channel adjusted syndrome that is exactly equal to zero, since such "signature" implies that applying that channel mark in conjunction with potential existing chip marks, would fully resolve the error. If a unique choice exists, the syndrome selection circuitry chooses to select such syndrome, which of course by definition is equal to zero. It also selects the corresponding channel adjusted syndrome, which is general non-zero.

If all the chip and channel adjusted syndromes are equal to zero:

$$\hat{S}^{(-0)} = \hat{S}^{(-1)} = \hat{S}^{(-2)} = \hat{S}^{(-3)} = \hat{S}^{(-4)} = 0$$

then, the decoder at this moment has learned that no new error has taken place, beyond any error potentially present in chips that are marked. In this case, the syndromes corresponding to the fifth channel (both channel adjusted and chip and channel adjusted) are selected as a default action.

The final case is when there are at least two distinct channels i,j with $$\hat{S}^{(-i)} = \hat{S}^{(-j)} = 0$$

In this case, the decoder does not have enough information to decide which is the failing channel and declares an uncorrectable error.

Syndrome decoder. In an embodiment, once a choice for what chip and channel adjusted syndromes to employ has been made, the decoder proceeds to decode the resulting syndromes. Throughout this discussion the terminology "error magnitude" will refer to the bit flip masks that need to be applied to a chip in order to correct its error.

It is important to note that this stage of the decoder processes both the channel adjusted syndromes as well as the chip and channel adjusted syndromes. The latter are analyzed first when attempting to find the location and magnitude of a potential new chip error, and the former are then employed when computing the error magnitudes of the chips that are marked.

If the chip and channel adjusted syndrome is zero, no further errors have been detected and hence all that remains is to compute the error magnitudes associated with the channel marked and the chips marked.

If the chip and channel adjusted syndrome is nonzero, this implies that there is an error that must be analyzed to see whether it is correctable, and if so, to correct it. In an embodiment this includes two steps. The first step is the computation of the error magnitude e and location r of a potential new chip error. A salient feature of this step is that the location computation procedure entails solving a quartic that due to its special structure, admits a simplified implementation. The quartic does result in four possible solutions for r, but the mathematical properties of the code are such that when there is a new single chip error, it is guaranteed that only one of the four possible solutions will correspond to a valid chip location. The decoder compares the roots of the quartic against the possible valid chip locations and eliminates from the list those roots that are not valid. The second step is the computation of the error magnitudes $e_x$ and $e_y$ of the chips pointed to by x and y. The outcome of this step is self explanatory. It is important to note though that both $e_x$ and $e_y$ are computed even if x, or y or both are pointing to their default location. If x is pointing to its default location, then $e_x$=0 in the absence of uncorrectable errors; similarly for y.

Bit flip mask generation and flags generation. In an embodiment, this is the last stage of decoding. This stage requires access to $e_x$, $e_y$, e and r, as well as the syndrome Z, among other findings of the decoder. In principle, the following prescription results in the desired correction: the bit flip masks $e_x$, $e_y$, and e are applied to the chips pointed to x, y and r, respectively, unless the chip pointed to is not a valid chip location (for example, a default value for x is not a valid chip location for x). Then the contents of the channel i* are replaced with the XOR of the chip corrected contents of the other 4 channels. It is important to note that in an embodiment, the values of x and y must correspond.

An actual implementation of an embodiment in the decoder may achieve the above in a different manner, because the decoder needs to generate an overall bit flip mask for the data in all five channels that is then applied to the data as a single last step. In an embodiment, the bit flip mask is generated as follows. As in the description above, the values of $e_x$, $e_y$, e and x, y, and r are used to generate the bit flip mask corresponding to "chip corrections"; note that this is one mask for each of the 4 channels that are not marked (equivalently, that are not assigned the index i*). Then, each of the masks for the 4 channels is applied to the Z syndrome that is forwarded to this stage from the initial syndrome generation stage. The result of this operation becomes the bit flip mask of the channel that is marked (i*).

Also in this section the decoder computes the uncorrectable error flag. There are various invalid conditions that the decoder checks for in order to form an overall uncorrectable error flag; it is important to note that it is important to capture all possible invalid states for the decoder in order to obtain the maximum amount of protection against potential mis-corrections.

A particular UE condition that is worth singling out due to its special significance relates to the claim in the last two columns of the table in FIG. 3 for state F. Note that the table indicates that single bit errors are correctable whereas double bit errors are fully detectable. Disallowing corrections of new errors in state F that have 2 or more bits in error in one 16-bit symbol, results in any double bit error always be detected. This property is obtained by a very careful choice of the "chip indexing" function that is described in a later section of this document, and has been proved to be true by an exhaustive computer manipulation of the parity check matrix of the code.

No external channel mark. In this case, an embodiment of the decoder is responsible for correcting up to two chip marks, and an unknown chip error or channel error. An important consideration is the decoder, in this mode, internally treats unknown chip errors as channel errors, and corrects them accordingly. In this setting, the syndromes obtained in the "syndrome selection" stage described above are equal to zero, and therefore the circuits under "syndrome decoder" that look for new errors do not find any. This design stems from the fact that the decoder does not make a distinction on the number of errors present in a channel when it detects a channel error.

External channel mark specified. In contrast to the no external channel mark situation, in this mode new chip errors result in a nonzero chip and channel adjusted syndrome selected in the "syndrome and mark selector". Thus, new errors are resolved using the "syndrome decoder" stage. This remark together with the previous one implies that the mechanisms for correcting new single chip errors differ according to whether there is an external channel mark or not.

Figure 6:
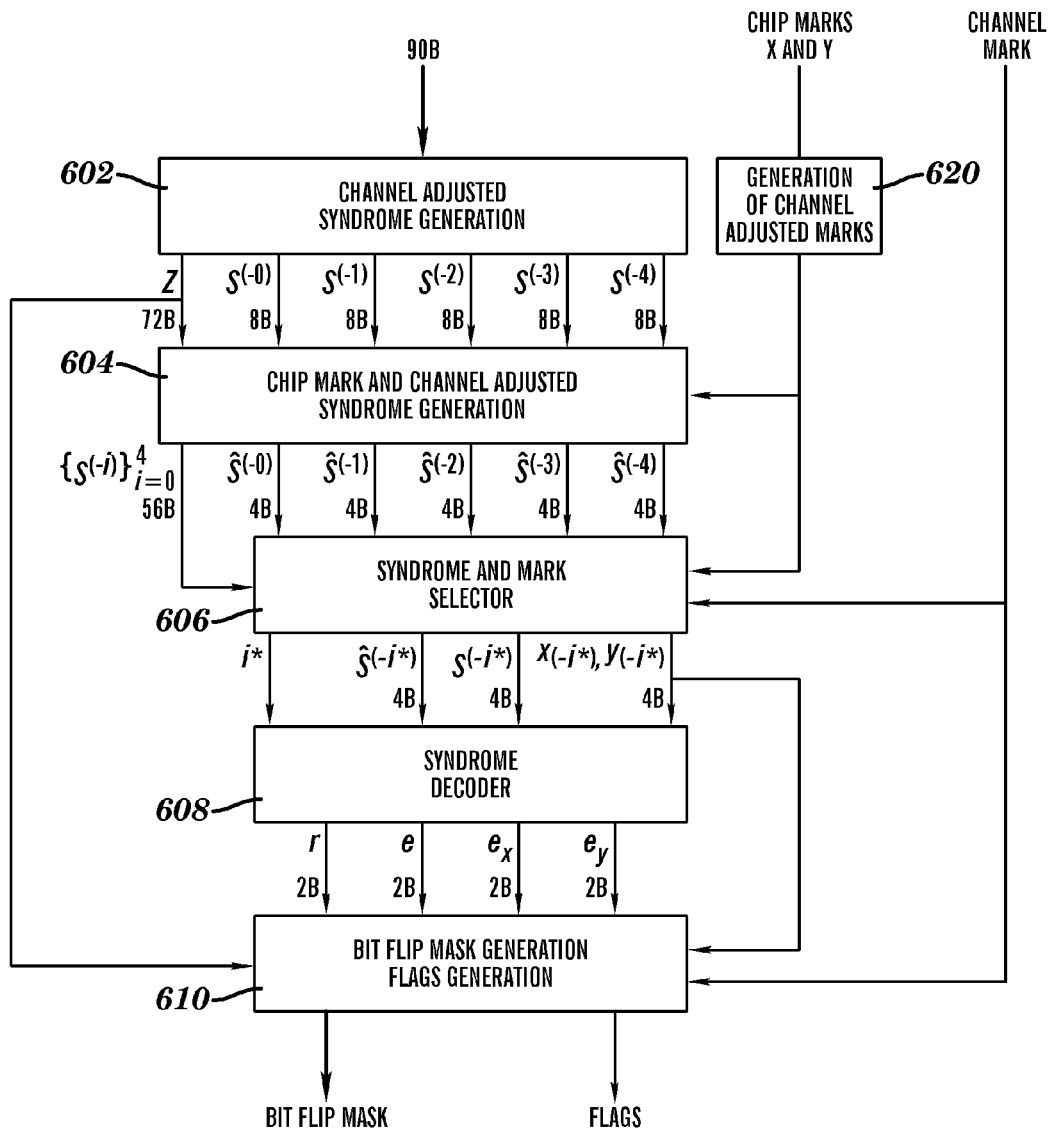
FIG. 6 depicts a process flow of a decoder in accordance with an embodiment.

FIG. 6 depicts a summary of the process flow described above and implemented by an embodiment of the decoder. In an embodiment that utilizes a double data rate three (DDR3) device, a sixteen bit symbol is received over two transfers. In an embodiment, the RAIM code is applied four times across the burst of 8 in each DRAM, each processing 64 bytes (B) worth of data for a total of 256 B. Input to the process includes data from the 5 channels, the chip marks and the channel mark. At block 602, channel adjusted syndrome generation is performed and at block 620 channel adjust marks are generated. At block 604, chip mark and channel adjust syndrome generation is performed, and at block 606, syndrome and mark selection are performed. At block 608, syndrome decoding is performed and at block 610, bit flip masks and flags are generated and output.

The following section describes Galois field arithmetic that is implemented by an embodiment. In an embodiment: GF(16) elements are polynomials of degree less than 4 in the variable u, where operations are done modulo $1+u+u^4$; GF(256) elements are polynomials of degree less than 2 in the variable v, with operations done modulo $1+u^3+v+v^2$; and GF(65536) elements are polynomials of degree less than 2 in the variable z, with operations done modulo $(u^2+u^3)v+z+z^2$. As described herein, the convention followed is that the bit pattern $b_0 b_1 \ldots b_{14} b_{15}$, which is ordered in agreement with the manner in which VHDL ("very high speed integrated circuit hardware description language") orders bits denotes the GF(65536) element:

$$[(b_0+b_1 u+b_2 u^2+b_3 u^3)+(b_4+b_5 u+b_6 u^2+b_7 u^3)v]+[(b_8+b_9 u+b_{10} u^2+u^3)+(b_{12}+b_{13} u+b_{14} u^2+b_{15} u^3)v]z$$

The construction of the GF(65536) field is such that it is natural to think of one such element as four elements of GF(16) concatenated. With this in mind, introduced is the convention that the GF(65536) symbol $(a_0+a_1 v)+(a_2+a_3 v)z$ where $a_0, a_1, a_2, a_3$ are GF(16) elements may also be written as the vector:

$$\begin{bmatrix} a_0 \\ a_1 \\ a_2 \\ a_3 \end{bmatrix}$$

Thus for example within this convention:

$$\begin{bmatrix} \gamma \\ 0 \\ 0 \\ 0 \end{bmatrix} \begin{bmatrix} a_0 \\ a_1 \\ a_2 \\ a_3 \end{bmatrix} = \begin{bmatrix} \gamma a_0 \\ \gamma a_1 \\ \gamma a_2 \\ \gamma a_3 \end{bmatrix}$$

where $\gamma$ is a GF(16) element.

Following is a description of the symbols associated with each chip location in an embodiment. The GF $(2^{16})$ symbol associated with channel $k\in\{0, 1, 2, 3, 4\}$, chip index $j\in\{1, 2, 3, 4, 5, 6, 7, 8\}$ is given by:

$$X_{k,j} = \beta_k \begin{bmatrix} 1 \\ u^{I(j)} \\ u^{2I(j)} \\ u^{3I(j)} \end{bmatrix}$$

where $I(j)$ is the indexing function that sets $I(1, 2, \ldots, 8, 9, 10)=\{2, 4, 6, 7, 8, 9, 10, 11, 12, 13\}$, and the $\beta_i$ are GF(16) elements given by:

$\beta_0 = 1$ $\beta_1 = u$ $\beta_2 = u^2$ $\beta_3 = u^3$ $\beta_4 = 1+u+u^2+u^3$ $\beta_5 = 1+u$ In an embodiment, the checks are stored in locations $X_{0,0}, \ldots X_{4,0}$ which in turn is defined as $$X_{k,0} = \begin{bmatrix} \beta_k \\ 0 \\ 0 \\ 0 \end{bmatrix}$$

for $k\in\{0, 1, 2, 3, 4\}$. The two default symbols for the x and y marks are given by:

$$X_{def} = \beta_5 \begin{bmatrix} 1 \\ u^{I(9)} \\ u^{2I(9)} \\ u^{3I(9)} \end{bmatrix}$$

$$Y_{def} = \beta_5 \begin{bmatrix} 1 \\ u^{I(10)} \\ u^{2I(10)} \\ u^{3I(10)} \end{bmatrix}$$

The role of the indexing function $I(\cdot)$ is to enable the single bit correct/double bit detect feature when a channel is marked and two chips are marked.

Following is a description of an embodiment of the parity check matrix along with key properties. The parity check matrix is $H=[H_0\ H_1\ H_2\ H_3\ H_4]$ where $H_i$ for $i\in\{0, 1, 2, 3, 4\}$ is given by:

$$H_i = \begin{bmatrix} X_{i,0} & X_{i,1} & \ldots & X_{i,8} \\ X_{i,0}^2 & X_{i,1}^2 & \ldots & X_{i,8}^2 \\ X_{i,0}^4 & X_{i,1}^4 & \ldots & X_{i,8}^4 \\ X_{i,0}^8 & X_{i,1}^8 & \ldots & X_{i,8}^8 \end{bmatrix}$$

The following auxiliary matrices are defined:

$H^{(-0)} = [H_1 \oplus H_0\ H_2 \oplus H_0\ H_3 \oplus H_0\ H_4 \oplus H_0]$ $H^{(-1)} = [H_0 \oplus H_1\ H_2 \oplus H_1\ H_3 \oplus H_1\ H_4 \oplus H_1]$ $H^{(-2)} = [H_0 \oplus H_2\ H_1 \oplus H_2\ H_3 \oplus H_2\ H_4 \oplus H_2]$ $H^{(-3)} = [H_0 \oplus H_3\ H_1 \oplus H_3\ H_2 \oplus H_3\ H_4 \oplus H_3]$ $H^{(-4)} = [H_0 \oplus H_4\ H_1 \oplus H_4\ H_2 \oplus H_4\ H_3 \oplus H_4]$ The following is the basic result for this code, which essentially ensures that the "error mirroring" effect caused by correcting a failed channel does not result on a reduced error correction and correction degradation with respect to having used a fully maximum-distance separable (MDS) code.

Theorem 1. Each of the matrices $H^{(-i)}$ for $i\in\{0, 1, 2, 3, 4\}$ is MDS over $GF(2^{16})$ this is, the 4×4 matrix with entries from $GF(2^{16})$ formed by selecting any four columns is invertible.

As a matter of fact, a stronger and useful result holds. Let $$A = \begin{bmatrix} X_{SPUE} & X_{def,(-i^*)} & Y_{def,(-i^*)} \\ X_{SPUE}^2 & (X_{def,(-i^*)})^2 & (Y_{def,(-i^*)})^2 \\ X_{SPUE}^4 & (X_{def,(-i^*)})^4 & (Y_{def,(-i^*)})^4 \\ X_{SPUE}^8 & (X_{def,(-i^*)})^8 & (Y_{def,(-i^*)})^8 \end{bmatrix}$$

Then the following holds:

Result 1. Each of the matrices $[H^{(-i)}\ A]$ for $i\in\{0, 1, 2, 3, 4\}$ is MDS over $GF(2^{16})$, that is, the 4×4 matrix with entries from $GF(2^{16})$ formed by selecting any four columns is invertible. This result is of importance to obtain various desired properties for the error control code when default marks and SPUE are involved. The proof of Theorem 1 is based on purely algebraic arguments. The proof of Result 1, is via an exhaustive computer checking.

Following is a description of an embodiment of the decoder.

The following computes the regular syndromes of the code:

$Z = D_0 \oplus D_1 \oplus D_2 \oplus D_3 \oplus D_4$ $S = H_0 D_0 \oplus H_1 D_1 \oplus H_2 D_2 \oplus H_3 D_3 \oplus H_4 D_4$ Due to the manner in which the parity check matrix is defined, the indexing of the vector S follows the following convention:

$$S = \begin{bmatrix} S_1 \\ S_2 \\ S_4 \\ S_8 \end{bmatrix}$$

The following computes the syndromes for each possible channel mark:

$S^{(-i)} = S \oplus H_i Z\ i\in\{0,1,2,3,4\}$

The two chip marks are x, y. Adjusted for channel mark i, the chip marks are $x_{(-i)}$ and $y_{(-i)}$; see below for an example embodiment of how to compute the adjusted marks.

The following computes the syndromes that incorporate the 2 chip marks for each possible channel mark:

$\hat{S}_1^{(-i)} = (x_{(-i)} y_{(-i)}^2 \oplus x_{(-i)}^2 y_{(-i)}) S_1^{(-i)} \oplus (x_{(-i)} y_{(-i)}^2 \oplus x_{(-i)}^2 y_{(-i)}^2) S_2^{(-i)} \oplus S_4^{(-i)} i\in\{0,1,2,3,4\}$ $\hat{S}_2^{(-i)} = (x_{(-i)}^2 y_{(-i)}^4 \oplus x_{(-i)}^4 y_{(-i)}^2) S_2^{(-i)} \oplus (x_{(-i)}^2 y_{(-i)}^2 \oplus x_{(-i)}^4 y_{(-i)}^4) S_4^{(-i)} \oplus S_8^{(-i)} i\in\{0,1,2,3,4\}$ (1)

The following computes the flag that determines whether a given channel mark solves the error equations:

$$F_i = (\hat{S}_1^{(-i)} == 0) \,\&\&\, (\hat{S}_2^{(-i)} == 0) \, i \in \{0,1,2,3,4\}$$

The value of i* is then determined as follows:

If an external channel mark has been passed to the decoder, then set i* to be the value of that external channel mark.

If no external channel mark has been passed then, if exactly one of the $F_i$ flags is true, i* is assigned to the corresponding index. If no external channel mark has been passed and none of the $F_i$ flags are true (or two or more are true), then set i*=4 (a default value).

The error magnitude for a possible new error is computed with:

$$e = \frac{(\hat{S}_1^{(-i^*)})^2}{\hat{S}_2^{(-i^*)}}$$

The error location is found as follows. First compute:

$$\alpha = \frac{\hat{S}_2^{(-i^*)}}{\hat{S}_1^{(-i^*)}}$$

Conceptually, first it is required to find a value of r that satisfies the quartic equation:

$$r^4 \oplus r^2(x_{(-i^*)} y_{(-i^*)} \oplus x_{(-i^*)}^2 \oplus y_{(-i^*)}^2) \oplus r(x_{(-i^*)} y_{(-i^*)}^2 \oplus x_{(-i^*)}^2 y_{(-i^*)}) \oplus \alpha = 0$$

It is possible that there is no such solution, in which case an uncorrectable error condition has been identified. The error magnitudes for the erased locations can be found from:

$$e_x = \frac{y_{(-i^*)}(S_2^{(-i^*)} \oplus r^2 e) \oplus y_{(-i^*)}^2(S_1^{(-i^*)} \oplus re)}{x_{(-i^*)} y_{(-i^*)}^2 \oplus x_{(-i^*)}^2 y_{(-i^*)}}$$

$$e_y = \frac{x_{(-i^*)}(S_2^{(-i^*)} \oplus r^2 e) \oplus x_{(-i^*)}^2(S_1^{(-i^*)} \oplus re)}{x_{(-i^*)} y_{(-i^*)}^2 \oplus x_{(-i^*)}^2 y_{(-i^*)}}$$

In an embodiment, an algebraic method is utilized for solving the quartic. This method also allows a computation of the associated error magnitudes $e_x$, $e_y$ in a manner synergistic to the solution of the quartic. First compute:

$$d_x = \frac{1}{x_{(-i^*)}(y_{(-i^*)} \oplus x_{(-i^*)})}$$

$$d_y = \frac{1}{y_{(-i^*)}(y_{(-i^*)} \oplus x_{(-i^*)})}$$

Next, obtain $w_x$, $w_y$ as solutions for the quadratics $$w_x^2 + w_x + \alpha d_x^2 = 0$$

$$w_y^2 + w_y + \alpha d_y^2 = 0$$

through the module $w_x$=quadroot($\alpha d_x^2$) $w_y$=quadroot($\alpha d_y^2$). Then use $w_x$, $w_y$ to compute r, $e_x$ and $e_y$ with the following equations:

$$e_x = d_x(S_2^{(-i^*)} \oplus y_{(-i^*)} S_1^{(-i^*)}) \oplus e w_x$$

$$e_y = d_y(S_2^{(-i^*)} \oplus x_{(-i^*)} S_1^{(-i^*)}) \oplus e w_y$$

$$r = x_{(-i^*)} w_x \oplus y_{(-i^*)} w_y$$

Next there are two broad cases:

d(r=0). This happens if and only if $\alpha$=0. In this case, both $e_x$ and $e_y$ have the correct error magnitude for the marked chip position (the marks possibly being default). Also it will be true that e=0.

d(r≠0). This happens if and only if $\alpha$≠0, and therefore e≠0. In this case we need to test which of the following expressions is a valid location:

$$r, r \oplus x_{(-i^*)}, r \oplus y_{(-i^*)}, r \oplus x_{(-i^*)} \oplus y_{(-i^*)}$$

The valid locations are given by the chip locations adjusted for channel i* AND the $X_{SPUE}$ location (without any adjustment whatsoever), for a total of N(M−1)+1 locations. The code is constructed so that when a new chip error is present, or when $X_{SPUE}$ is injected in the absence of a new error, exactly one of the expressions above will be valid.

If it is determined that exactly one of the expressions is valid, then r is added the appropriate term (either $x_{(-i^*)}$, or $y_{(-i^*)}$, or $x_{(-i^*)} \oplus y_{(-i^*)}$. If it is needed to add $x_{(-i^*)}$ to r, then set $e_x \leftarrow e_x \oplus e$. If it is needed to add $y_{(-i^*)}$ to r, then set $e_y \leftarrow e_y \oplus e$. These actions are summarized below in a chart that summarizes the updates to r, $e_x$ and $e_y$ that need to be performed according to which solution to the quartic is found to be a valid solution:

| Valid location | New value for $e_x$ | New value for $e_y$ |
| --- | --- | --- |
| r←r | $e_x \leftarrow e_x$ | $e_y \leftarrow e_y$ |
| r←r⊕$x_{(-i^*)}$ | $e_x \leftarrow e_x \oplus x_{(-i^*)}$ | $e_y \leftarrow e_y$ |
| r←r⊕$y_{(-i^*)}$ | $e_x \leftarrow e_x$ | $e_y \leftarrow e_y \oplus y_{(-i^*)}$ |
| r←r⊕$x_{(-i^*)}$⊕$y_{(-i^*)}$ | $e_x \leftarrow e_x \oplus x_{(-i^*)}$ | $e_y \leftarrow e_y \oplus y_{(-i^*)}$ |

Finally, it is needed to trap some uncorrectable error situations. These are summarized as follows: the quartic has no solutions whatsoever; the quartic does not have exactly one valid solution; and the valid solution to the quartic is equal to $X_{SPUE}$. If any of the situations above hold, then the uncorrectable error flag is raised. One embodiment for doing this, which is described herein, is to set, r←0 if any of the above holds. Because in this case e≠0, the $UE_3$ condition described below will ensure that these will be caught as uncorrectable errors.

After the processing of these two broad cases, the process continues with the computation of the UE flag, as well as the potential bit flipping correction stage. Recall that if it is the case that $\beta_x$=i* then the x was moved to $X_{def}$ for the purposes of computing $x_{(-i^*)}$. When computing the UE flag it is required to use "moved" x mark as well. An identical statement holds true for the y mark. To this end, let $$\hat{x} = \begin{cases} x & \beta_x \neq \beta_{i^*} & (2) \\ X_{def} & \beta_x = \beta_{i^*} & (3) \end{cases} \quad (2)$$

$$\hat{y} = \begin{cases} y & \beta_y \neq \beta_{i^*} & (5) \\ Y_{def} & \beta_y = \beta_{i^*} & (6) \end{cases} \quad (3)$$

The global UE flag is computed by joining together several partial UE flags. In an embodiment, these conditions include:

0. The syndromes adjusted for channel i* and the chip marks must either be both zero or both nonzero. $UE_0 = (\hat{S}_1^{(-i^*)} == 0) \oplus (\hat{S}_2^{(-i^*)} == 0)$ 1. If there is no external channel mark, then the $\{F_i\}_i$ flags must report either that exactly one channel can resolve the problem or that all channels can resolve the problem. Thus, letting count denote the number of flags $F_i$ that are true, $UE_1=(\text{passed\_external\_channel\_mark}==\text{FALSE})\&\&(\text{count}\neq 1)\&\&(\text{count}\neq 5)$ 2. This computes the UE's flag contribution coming from correcting the erasures. Note the use of $\hat{x}$ and $\hat{y}$ instead of x, y, respectively. $UE_2=((\hat{x}==X_{def})\&\&(e_x!=0))||((\hat{y}==Y_{def})\&\&(e_y!=0))$ This flag is used also in the computation of the SPUE flag.
3. This computes the UE's flag contribution coming the various exception cases when processing the solution to the quartic.

$UE_3=((r==0)\&\&(e\neq 0));$

4. This computes the UE flag that ensures the single bit correct/double bit detect with a channel mark. Let weight(e) denote the number of bits set to one (out of the 16 bits).

$UE_4=((\text{weight}(e)>1)\&\&(\hat{x}\neq X_{def})\&\&(\hat{y}\neq Y_{def}))$

5. This flag is important to ensure that a channel failure when there is no channel marked never mis-corrects. The reason this condition is needed is because some channel failures have the property that all of the 5 $F_i$ flags turn out to be true. $^{ox}UE_5$ is set to be true if all the following hold: there is no external channel mark; all of the 5 $F_i$ flags are true; and there are corrections outside of non-default chip marks.

The complete UE flag can then be computed using:

$UE=UE_0||UE_1||UE_2||UE_3||UE_4||UE_5$

In an embodiment, the correction is performed by letting $D_{i*} \leftarrow D_{i*} \oplus Z$ and then applying the corrections ($e_x$, $e_y$, e) to both locations mirroring the errors.

Following is a description of an embodiment of a method for adjusting the marks to reflect a channel mark. It is assumed that the channel being marked is denoted by the index $i \in \{0, 1, 2, 3, 4\}$. The method for adjusting the marks for x and y is described by $$x_{(-i)} = \begin{cases} \left(\frac{\beta_x + \beta_i}{\beta_x}\right)x & \beta_x \neq \beta_i \\ \left(\frac{\beta_5 + \beta_i}{\beta_5}\right)X_{def} & \beta_x = \beta_i \end{cases}$$

$$y_{(-i)} = \begin{cases} \left(\frac{\beta_y + \beta_i}{\beta_y}\right)y & \beta_y \neq \beta_i \\ \left(\frac{\beta_5 + \beta_i}{\beta_5}\right)Y_{def} & \beta_y = \beta_i \end{cases}$$

Following is an analysis of uncorrectable channel failures in an embodiment. With a small probability, this code is unable to correct for an unmarked channel failure. This section analyzes the precise conditions in which this happens. An unmarked channel failure is uncorrectable when it is the case that there is a subset At $\{0, 1, 2, 3, 4\}$, such the number of elements in A is two or greater and furthermore we have that for $i \in A$, $(\hat{S}_1^{(-i)}==0)\&\&(\hat{S}_2^{(-i*)}==0)$ Pick any two distinct i, $j \in A$ A. The case of no chips marked. In the case there are no chips marked, and by letting E to be the channel failure error vector, and $g \in \{0, 1, 2, 3, 4\}$ the index of the failing channel, results in $Z=E$ and $S=H_g E$ so that for every $i \in \{0, 1, 2, 3, 4\}$, $S^{(-i)}=(H_g \oplus H_i)E$ The code construction is such that for every $i \in \{0, 1, 2, 3, 4\}$, $H_i=B_i H_0$, where $B_i$ the diagonal matrix given by $$B_i = \begin{bmatrix} \beta_i & 0 & 0 & 0 \\ 0 & \beta_i^2 & 0 & 0 \\ 0 & 0 & \beta_i^4 & 0 \\ 0 & 0 & 0 & \beta_i^8 \end{bmatrix}$$

From this, it can easily identify a class of errors that are uncorrectable. Write $S^{(-i)}=(H_g \oplus H_i)E=(B_g \oplus B_i)H_0 E$ and consider the class of errors $U=\{E: H_0 E=0\}$. Clearly, it can be shown that for $E \in U$, for every $i \in \{0, 1, 2, 3, 4\}$, $S^{(-i)}=0$ and therefore $\hat{S}_1^{(-i)}=\hat{S}_2^{(-i)}=0$, showing that this class of errors is uncorrectable.

More generally it can be seen that $\hat{S}_1^{(-i)}=\hat{S}_2^{(-i)}=0$ if and only if there exists $\psi_1, \psi_2$ such that equation (4) below holds:

$$\begin{bmatrix} X_{def} & Y_{def} \\ X_{def}^2 & Y_{def}^2 \\ X_{def}^4 & Y_{def}^4 \\ X_{def}^8 & Y_{def}^8 \end{bmatrix} \begin{bmatrix} \psi_1 \\ \psi_2 \end{bmatrix} = (B_g \oplus B_i)H_0 E$$

Note that for all distinct i, $j \in \{0, 1, 2, 3, 4\}$, $\beta_i \neq \beta_j$ and therefore $B_i \oplus B_j$ is an invertible matrix. Thus $(B_g \oplus B_i)H_0$ has full rank, and for fixed $\psi_1, \psi_2$ there are multiple choices for E that will solve this equation. By then varying $\psi_1, \psi_2$, the set of all possible errors E that are uncorrectable can be obtained.

The special case described earlier corresponds to the class of uncorrectable errors that can be found by setting $\psi_1=\psi_2=0$.

The following text described special uncorrectable errors (SPUEs).

Analysis: Adding an SPUE at encoding time.

The overall parity check of the RAIM code is given by the $(N+r) \times (MN)$ matrix $$H = \begin{bmatrix} I_N & I_N & I_N & I_N & I_N \\ H_0 & H_1 & H_2 & H_3 & H_4 \end{bmatrix}$$

where N=9, r=4, $I_N$ represents the N×N identity matrix, and $H_i$ represents the r×N section of the parity check matrix that contributions to the formation of the bottom r syndromes for the data and checks in the ith channel.

The general method for incorporating an SPUE is based on an augmented version of the above equation, given by equation (5) below $$H_{aug} = \begin{bmatrix} I_N & I_N & I_N & I_N & I_N & 0 \\ & & & & & X_{SPUE} \\ H_0 & H_1 & H_2 & H_3 & H_4 & X_{SPUE}^2 \\ & & & & & X_{SPUE}^4 \\ & & & & & X_{SPUE}^8 \end{bmatrix}$$

where the precise definition of $X_{SPUE}$ will be given in the subsequent discussion. Given the channel data vectors $\{D_i\}_{i=0}^{M-2}$ each of which has N−1=8 entries in $GF(2^{16})$ when the encoder wishes to store this data with an SPUE mark, it chooses the checks $c_0$, $c_1$, $c_2$, $c_3$ (each of which is a single entry in GF ($2^{16}$) so as to satisfy the equation $$H_{aug} \begin{bmatrix} c_0 \\ D_0 \\ c_1 \\ D_1 \\ c_2 \\ D_2 \\ c_3 \\ D_3 \\ c_0 \oplus c_1 \oplus c_2 \oplus c_3 \\ D_0 \oplus D_1 \oplus D_2 \oplus D_3 \\ 1 \end{bmatrix} = 0$$

This can be done as follows. Let $\hat{c}_0$, $\hat{c}_1$, $\hat{c}_2$, $\hat{c}_3$ and $\tilde{c}_0$, $\tilde{c}_1$, $\tilde{c}_2$, $\tilde{c}_3$ satisfy the following equations:

$$H_{aug} \begin{bmatrix} \hat{c}_0 \\ 0 \\ \hat{c}_1 \\ 0 \\ \hat{c}_2 \\ 0 \\ \hat{c}_3 \\ 0 \\ \hat{c}_0 \oplus \hat{c}_1 \oplus \hat{c}_2 \oplus \hat{c}_3 \\ 0 \\ 1 \end{bmatrix} = 0, \quad H_{aug} \begin{bmatrix} \tilde{c}_0 \\ D_0 \\ \tilde{c}_1 \\ D_1 \\ \tilde{c}_2 \\ D_2 \\ \tilde{c}_3 \\ D_3 \\ \tilde{c}_0 \oplus \tilde{c}_1 \oplus \tilde{c}_2 \oplus \tilde{c}_2 \\ D_0 \oplus D_1 \oplus D_2 \oplus D_3 \\ 0 \end{bmatrix} = 0$$

By defining $c_i = \hat{c}_i \oplus \tilde{c}_i$ for $i \in \{0, 1, 2, 3\}$ and summing the two equations above (sum=$\oplus$), equation (5) is obtained, as desired. Now recall that the first column of $H_i$ is associated with the check symbol for channel i) is equal to $$\begin{bmatrix} \beta_i \\ \beta_i^2 \\ \beta_i^4 \\ \beta_i^8 \end{bmatrix}$$

Therefore, in an embodiment, to compute $\hat{c}_0$, $\hat{c}_1$, $\hat{c}_2$, $\hat{c}_3$ the following equation (equation 6) needs to be solved:

$$\begin{bmatrix} \beta_0 \oplus \beta_4 & \beta_1 \oplus \beta_4 & \beta_2 \oplus \beta_4 & \beta_3 \oplus \beta_4 \\ \beta_0^2 \oplus \beta_4^2 & \beta_1^2 \oplus \beta_4^2 & \beta_2^2 \oplus \beta_4^2 & \beta_3^2 \oplus \beta_4^2 \\ \beta_0^4 \oplus \beta_4^4 & \beta_1^4 \oplus \beta_4^4 & \beta_2^4 \oplus \beta_4^4 & \beta_3^4 \oplus \beta_4^4 \\ \beta_0^8 \oplus \beta_4^8 & \beta_1^8 \oplus \beta_4^8 & \beta_2^8 \oplus \beta_4^8 & \beta_3^8 \oplus \beta_4^8 \end{bmatrix} \begin{bmatrix} \hat{c}_0 \\ \hat{c}_1 \\ \hat{c}_2 \\ \hat{c}_3 \end{bmatrix} = \begin{bmatrix} X_{SPUE} \\ X_{SPUE}^2 \\ X_{SPUE}^4 \\ X_{SPUE}^8 \end{bmatrix}$$

In summary, in order to incorporate an SPUE into the codeword in an embodiment, take the checks $\tilde{c}_0$, $\tilde{c}_1$, $\tilde{c}_2$, $\tilde{c}_3$ from the standard output of the encoder and then XOR these with the checks $\hat{c}_0$, $\hat{c}_1$, $\hat{c}_2$, $\hat{c}_3$ computed from solving equation (6).

Specific values used for SPUE encoding and detection in an embodiment. The following choice for $X_{SPUE}$ passes all the relevant tests for an SPUE described above and it addi-tionally has the property that when a channel is marked and two chips are marked, a single bit error injected and an SPUE is present, the decoder will not mis-correct. Using the bit ordering $b_0 b_1 \ldots b_{15}$, this design chooses $X_{SPUE} = 1000110111010101$ $\hat{c}_0 = 1011010110110000$ $\hat{c}_1 = 1001001011101000$ $\hat{c}_2 = 1111100001100000$ $\hat{c}_3 = 1000100011111000$ $\hat{c}_4 = 0101011111000000$ Decoder processing of an SPUE with no unmarked errors in an embodiment. The methodology for this section is to follow the decoder processing in order to understand how a 90 B chunk of data that has an SPUE is processed. Using the notation from the previous subsection, what the decoder receives is $$A_{recvd} = \begin{bmatrix} c_0 \\ D_0 \\ c_1 \\ D_1 \\ c_2 \\ D_2 \\ c_3 \\ D_3 \\ c_0 \oplus c_1 \oplus c_2 \oplus c_3 \\ D_0 \oplus D_1 \oplus D_2 \oplus D_3 \end{bmatrix} \oplus \Delta$$

where $\Delta$ is a vector with NM entries in GF($2^{16}$) that represents all of the errors affecting the data received. For this part of the analysis it is not assumed that these errors are necessarily marked or even correctable. Recall also from the previous subsection that $c_i = \tilde{c}_i \oplus \hat{c}_i$.

The first stage of the decoder is to compute Z and S; these quantities are independent of the values of the marks passed to the decoder x and y as well as the value of the external channel mark. These values are given by $$\begin{bmatrix} Z \\ S \end{bmatrix} = HA_{recvd} = H\Delta \oplus \begin{bmatrix} 0 \\ \vdots \\ 0 \\ X_{SPUE} \\ X_{SPUE}^2 \\ X_{SPUE}^4 \\ X_{SPUE}^8 \end{bmatrix}$$

where there are N 0 entries in the rightmost vector above. Let $S_{not\,SPUE}$ be the syndromes obtained when exactly the same data is encoded without an SPUE, and when exactly the same errors are present in the data when it is retrieved. Thus $S_{not\,SPUE} = [H_0 H_1 H_2 H_3 H_4] \Delta$ Note that the Z syndrome is unaffected by the application of the SPUE mark, and therefore $Z_{not\,SPUE} = Z$ The decoder then computes the channel adjusted syndromes $S^{(-i)}$ for $i\in\{0, 1, 2, 3, 4\}$, using the formula $S^{(-i)}=S\oplus H_i Z$, obtaining:

$$S^{(-i)} = (S_{not\ SPUE} \oplus H_i Z) \oplus \begin{bmatrix} X_{SPUE} \\ X_{SPUE}^2 \\ X_{SPUE}^4 \\ X_{SPUE}^8 \end{bmatrix}$$

$$= S_{not\ SPUE}^{(-i)} \oplus \begin{bmatrix} X_{SPUE} \\ X_{SPUE}^2 \\ X_{SPUE}^4 \\ X_{SPUE}^8 \end{bmatrix}$$

where $S_{not\ SPUE}^{(-i)}$ denotes syndromes adjusted for channel i that would have been received if exactly the same data was encoded without an SPUE and exactly the same errors are present in the data when it is retrieved. The decoder next computes the chip and channel adjusted syndromes according to Equation (1). Note that in order to compute the chip and channel adjusted syndromes for every possible channel marked $i\in\{0, 1, 2, 3, 4\}$, the decoder internally moves any marks that are in a given channel to their default values. The label $x_{(-i)}$ and $y_{(-i)}$ is used to denote the channel adjusted marks that are obtained after the possible movement to their default location. Using the same methodology as before, it can be deduced that $$\hat{S}_1^{(-i)} = \hat{S}_{1,not\ SPUE}^{(-i)} \oplus (x_{(-i)}y_{(-i)}^2 \oplus x_{(-i)}^2 y_{(-i)})X_{SPUE} \oplus (x_{(-i)}y_{(-i)} \oplus x_{(-i)}^2 \oplus y_{(-i)}^2)X_{SPUE}^2 + X_{SPUE}^4$$

$$\hat{S}_2^{(-i)} = \hat{S}_{2,not\ SPUE}^{(-i)} \oplus (x_{(-i)}y_{(-i)}^2 \oplus x_{(-i)}^2 y_{(-i)})^2 X_{SPUE}^2 \oplus (x_{(-i)}y_{(-i)} \oplus x_{(-i)}^2 \oplus y_{(-i)}^2)^2 X_{SPUE}^4 + X_{SPUE}^8$$

Suppose now that there are no unmarked errors in the data received. It is known that if there was no SPUE encoded in the data the following would hold true $$\hat{S}_{1,not\ SPUE}^{(-i)} = 0$$

$$\hat{S}_{2,not\ SPUE}^{(-i)} = 0$$

and therefore the syndromes $\hat{S}_1^{(-i)}, \hat{S}_2^{(-i)}$ satisfy $$\hat{S}_1^{(-i)} = (x_{(-i)}y_{(-i)}^2 \oplus x_{(-i)}^2 y_{(-i)})X_{SPUE} \oplus (x_{(-i)}y_{(-i)} \oplus x_{(-i)}^2 \oplus y_{(-i)}^2)X_{SPUE}^2 + X_{SPUE}^4$$

$$\hat{S}_2^{(-i)} = (x_{(-i)}y_{(-i)}^2 \oplus x_{(-i)}^2 y_{(-i)})^2 X_{SPUE}^2 \oplus (x_{(-i)}y_{(-i)} \oplus x_{(-i)}^2 \oplus y_{(-i)}^2)^2 X_{SPUE}^4 + X_{SPUE}^8$$

In an embodiment, the design must ensure that for any $i\in\{0, 1, 2, 3, 4\}$, $\hat{S}_1^{(-i)} \neq 0$, $\hat{S}_2^{(-i)} \neq 0$, so that the decoder is not "tricked" into thinking that there is a correctable error that can be resolved using a channel mark. This leads to a first requirement for how to choose $X_{SPUE}$:

For all $i\in\{0, 1, 2, 3, 4\}$, $x, y \in \{X_{def}, Y_{def}\} \cup \{X_{i,j}\}_{i\in\{0,\ldots,4\}, j\in\{0,\ldots,8\}}$ $$0 \neq (x_{(-i)}y_{(-i)}^2 \oplus x_{(-i)}^2 y_{(-i)})X_{SPUE} \oplus (x_{(-i)}y_{(-i)} \oplus x_{(-i)}^2 \oplus y_{(-i)}^2)X_{SPUE}^2 + X_{SPUE}^4$$

Assuming this requirement is met (this will be shown later), the decoder then chooses i*=4 if no external channel mark was passed, or it sets i* equal to the external channel mark if one is given. The next step of the decoder is to compute $\alpha$ and e, which the decoder obtains as:

$$\alpha = \hat{S}_1^{(-i^*)}$$

$$e = 1$$

The decoder then proceeds to solve the quartic $$r^4 + r^2(x_{(-i)}y_{(-i)} + x_{(-i)}^2 + y_{(-i)}^2) + r(x_{(-i)}y_{(-i)}^2 + x_{(-i)}^2 y_{(-i)}) + \alpha = 0$$

This quartic has the four solutions $$X_{SPUE}$$

$$X_{SPUE} \oplus x_{(-i^*)}$$

$$X_{SPUE} \oplus y_{(-i^*)}$$

$$X_{SPUE} \oplus x_{(-i^*)} \oplus y_{(-i^*)}$$

Finally, recall from the decoder operation description that $\hat{x}$ and $\hat{y}$ are the actually employed channel marks (standard, not chaNnel adjusted, see Equation (7)). If $\hat{x}=X_{def}$, then even in the presence of an SPUE, we should never see $e_x \neq 0$. Similarly, if $\hat{y}=Y_{def}$, we should never see $e_y \neq 0$.

Summarizing the findings of an embodiment, a SPUE is determined by checking whether i) one of the solutions to the quartic is equal to $X_{SPUE}$; ii) e=1; iii) if $\hat{x}=X_{def}$ then $e_x=0$; iv) If $\hat{y}=Y_{def}$ then $e_y=0$. If these four conditions are true, then an SPUE is declared.

Note: conditions iii) and iv) above may be implemented ensuring that the SPUE flag is not set whenever $UE_2$ is on.

Analysis showing that correctable errors cannot be converted into SPUE's. It is of significant importance to demonstrate that no correctable error, on whatever combination of chip and channel marks and failures, can possibly be declared an SPUE. This may be in principle possible because when the decoder finds the 4 solutions to the quartic, it may be that one of the solutions is $X_{SPUE}$. It is shown below that this cannot happen by proper choice of $X_{SPUE}$. If a correctable error is such that $\hat{S}_1^{(-i^*)} = \hat{S}_2^{(-i^*)} = 0$ (this happens when all errors are marked or when a new error is solved by the RAIM correction machinery), then e=0 and therefore in this case there is never an SPUE declared. So suppose that there is an external channel mark and suppose that a new error has occurred in location l with an error magnitude of 1. Then $$S_1^{(-i^*)} = (x_{(-i)}y_{(-i)}^2 \oplus x_{(-i)}^2 y_{(-i)})l_{(-i)} \oplus (x_{(-i)}y_{(-i)} \oplus x_{(-i)}^2 \oplus y_{(-i)}^2)l_{(-i)}^2 + l_{(-i)}^4$$

$$S_2^{(-i^*)} = (x_{(-i)}y_{(-i)}^2 \oplus x_{(-i)}^2 y_{(-i)})^2 l_{(-i)}^2 \oplus (x_{(-i)}y_{(-i)} \oplus x_{(-i)}^2 \oplus y_{(-i)}^2)^2 l_{(-i)}^4 + l_{(-i)}^8$$

The decoder, as designed, computes e=1 and $\alpha=\hat{S}_1^{(-i^*)}$. It then finds as solutions to the quartic the following quantities:

$$l_{(-i)}$$

$$l_{(-i)} \oplus x_{(-i^*)}$$

$$l_{(-i)} \oplus y_{(-i^*)}$$

$$l_{(-i)} \oplus x_{(-i^*)} \oplus y_{(-i^*)}$$

Now, choose $X_{SPUE}$ so that regardless of the value of $i^*\in\{0, 1, 2, 3, 4\}$, and regardless of the value of x, y, l all of which can take on a maximum of N×M+2 values (the l symbol can only take on up to N×M values), none of the four quantities above can be equal to $X_{SPUE}$, then a correctable error will never become an SPUE.

A computer program has been written that tests whether a particular candidate for $X_{SPUE}$ is viable in the sense of the reasoning above. The value of $X_{SPUE}$ given in the this document has been shown to be viable in this manner. Note that this implies that whenever the SPUE flag is raised, the UE flag is raised as well.

Analysis of the probability of raising the SPUE flag when an uncorrectable error is present in an embodiment. Assume that $\hat{S}_1^{(-i^*)}$ and $\hat{S}_2^{(-i^*)}$ are independent random variables each uniformly distributed over $GF(2^{16})\setminus\{0\}$. The vast majority of the values that these variables can take correspond to uncorrectable errors. The question is asked, what is the probability that with such uniformly chosen syndromes one can call the result an SPUE? With this model, the values of e and α that the decoder computes are itself independent random variables each distributed over $GF(2^{16}) \setminus \{0\}$. With chance approximately $\frac{1}{2^{16}}$ the value that the decoder calculates for e is equal to one, which implies that the probability of converting an uncorrectable error into an SPUE is smaller than $\frac{1}{2^{16}}$. To complete this assessment one needs to compute the probability that when α is chosen at random, one of the solutions of the quartic is equal to $X_{SPUE}$.

Implementation Notes for embodiments described herein.

Computation of the regular syndromes (S) according to an embodiment. The computation of the syndrome S can be simplified by noting that:

$$H_i = B_i H_0$$

$$B_i = \begin{bmatrix} \beta_i & 0 & 0 & 0 \\ 0 & \beta_i^2 & 0 & 0 \\ 0 & 0 & \beta_i^4 & 0 \\ 0 & 0 & 0 & \beta_i^8 \end{bmatrix}$$

and therefore $S_i=[H_0]_i(D_0\oplus\beta_1^i D_1\oplus\beta_2^i D_2\oplus\beta_3^i D_3\oplus\beta_4^i D_4)$, where $[H_0]_i$ is the ith row of $H_0$, and where $i\in\{1, 2, 4, 8\}$. The nature of the simplification relies on the fact that each of the factors $\beta_i$ are elements of GF(16). If the computation of the syndromes S can be done in two cycles, then the hardware can be reduced by half as follows.

The matrix $H_0$ can be split in 4 sections, each of which has the same number of columns but ¼ of the number of rows:

$$H_0 = \begin{bmatrix} [H_0]_1 \\ [H_0]_2 \\ [H_0]_4 \\ [H_0]_8 \end{bmatrix}$$

The data from the channels $D_0$, $D_1$, $D_2$, $D_3$, $D_4$ is received from the DRAM interface in two cycles, which allows the $S_1$, $S_2$, $S_4$, $S_8$ syndromes to be computed using approximately half the circuitry than it would be required in a single cycle computation. Let $D_{k,i}$ for $i\in\{0, 1, \ldots, 8\}$ denote the symbol received in channel k for the ith chip, and let $[D_{k,i}]_j$ for $j\in\{0, 1, \ldots, 15\}$ denote the jth bit in symbol $D_{k,i}$. It is assumed that in the first transfer from the DRAM interface, the kth channel presents the bits $[D_{k,0}]_0[D_{k,0}]_1 \ldots [D_{k,0}]_7,[D_{k,1}]_0[D_{k,1}]_1 \ldots$
$[D_{k,1}]_7, \ldots, [D_{k,8}]_0[D_{k,8}]_1 \ldots [D_{k,8}]_7$ and in the $[D_{k,0}]_8[D_{k,0}]_9 \cdots [D_{k,0}]_{15}$, $[D_{k,1}]_8[D_{k,1}]_9 \cdots [D_{k,1}]_{15}, \ldots, [D_{k,8}]_8[D_{k,8}]_1 \ldots [D_{k,8}]_{15}$ This is accomplished as follows:

$F_{D_k}=[D_{k,0},D_{k,1}, \ldots, D_{k,7},0,0,0,0,0,0,0,0]$ $S_{D_k}=[D_{k,8},D_{k,9}, \ldots, D_{k,15},0,0,0,0,0,0,0,0]$ where $F_{D_k}$ stands for the FIRST bits coming from channel k and $S_{D_k}$ stands for the SECOND bits coming from channel k. Interpreting $F_{D_k}$ and $S_{D_k}$ as elements of $GF(2^{16})$, the method for computing the syndromes is then to compute $$S_i \leftarrow [H_0]_i(F_{D_0}\oplus\beta_1^i F_{D_1}\oplus\beta_2^i F_{D_2}\oplus\beta_3^i F_{D_3}\oplus\beta_4^i F_{D_4}) \quad (8)$$

and then when the second beat of data is received, $$S_i \leftarrow (1/z)S_i\oplus[H_0]_i(S_{D_0}\oplus\beta_1^i S_{D_1}\oplus\beta_2^i S_{D_2}\oplus \beta_3^i S_{D_3}\oplus\beta_4^i S_{D_4}) \quad (9)$$

where in the above, (1/z) denotes the inverse of the $GF(2^{16})$ element z (see Galois Field construction notes at the beginning of this document). The key point to notice is that each 16-bit symbol in the vector $(F_{D_0}\oplus\beta_1^i F_{D_1}r\beta_2^i F_{D_2}\oplus \beta_3^i F_{D_3}\oplus\beta_4^i F_{D_4})$ is of the form:

$[?,?,?,?,?,?,?,?,0,0,0,0,0,0,0,0]$ where ? is either 0 or 1. Multiplication of $[H_0]_i$ times a vector with symbols having this structure in fact only requires half of the binary columns of $[H_0]_i$ (more precisely, the first half of each symbol column). A similar remark applies to the computation in (9), which requires the same binary columns of $[H_0]_i$ as the computation (8).

An embodiment of computation of the channel adjusted syndromes. To compute the $S^{(-i)}$ syndromes, use $S^{(-i)}=S\oplus B_i(H_0 Z)$ An embodiment of a mathematical derivation of solution to the quartic. Given locations $x_1, \ldots, x_e \in GF(2^q)$ for some q, let eqnarray $\Lambda(x_1, \ldots, x_e)=\{a:a=\Sigma_{x\in X}x_i 0.1 \text{ in for some } 0.1 \text{ in } A\subset\{x_1, \ldots, x_e\}\}$ An embodiment of how to solve the quartic follows. For the $e_x$, $e_y$ computations, 4 coefficients needed to be calculated, the coefficient of $S_2$ in $e_x$ was $1/(x^2+xy)$, while the coefficients of $S_2$ in $e_x$ was $1/(y^2+xy)$. In this embodiment, instead of solving 2 quadratics serially, 2 quadratics are solved in parallel.

$$dr^4+r^2(xy+x^2+y^2)+r(xy^2+x^2y)+\alpha=0$$

is equivalent to either or both of the following 2 systems of equations:

$$r^2+yr=z_x$$

$$z_x^2+(xy+x^2)z_x=\alpha$$

$$r^2+xr=z$$

$$z_y^2+(xy+y^2)z_y=\alpha$$

The second equation in each set can be normalized using $z_x=(xy+x^2)w_x$ and $z_y=(xy+y^2)w_y$ to produce:

$$w_x^2+w_x = \frac{\alpha}{(xy+x^2)^2}$$

$$w_y^2+w_y = \frac{\alpha}{(xy+y^2)^2}$$

whose solutions are connected to the first equations via:

$$\frac{r^2+yr}{xy+x^2} = w_x$$

$$\frac{r^2+xr}{xy+y^2} = w_y$$

Using these identities the error value equations can be rewritten as:

$$e_x = \frac{S_2+yS_1}{x^2+xy}+ew_x$$

$$e_y = \frac{S_2+xS_1}{y^2+xy}+ew_y$$

Now consider $xw_x + yw_y$, using the equations above:

$$xw_x + yw_y = \frac{r^2 + yr}{x+y} + \frac{r^2 + xr}{x+y} = r$$

Note that no additional pre-computation is required since this embodiment is just using the square of the coefficients of $S_2$ for $e_i$. Now this embodiment can directly compute $r = xw_x + yw_y$, where it may be required to add 1 to either or both of $w_x$ and $w_y$ since each equation has 2 solutions. If 1 is added to $w_x$ then we add e to $e_x$, if 1 is added to $w_y$ then e is added to $e_x$.

When both x and y are zero, an embodiment computes r as the unique root of:

$$r^4 = \alpha$$

since taking fourth roots is a linear map on GF ($2^k$).

If y=0 but x is nonzero, an embodiment can solve for $w_x$ as above, and since:

$$w_x = \frac{r^2}{x^2}$$

an embodiment can recover r with:

$$r = x\sqrt{w_x}$$

Since the denominator for $e_x$ is well defined, the same formula remains valid when y=0. In this case set $e_x$=0.

FIG. 7 depicts a table that summaries updates that need to be performed to r, $e_x$ and $e_y$ that need to be performed according to which solution to the quartic is found to be a valid solution.

FIG. 8 depicts a table that includes a binary pattern corresponding to each symbol (equivalently chip or memory device) in an embodiment of the RAIM code. In an embodiment, this is the pattern that x and/or y need to be set to when the corresponding chip is to be marked as suspect.

Figure 9:
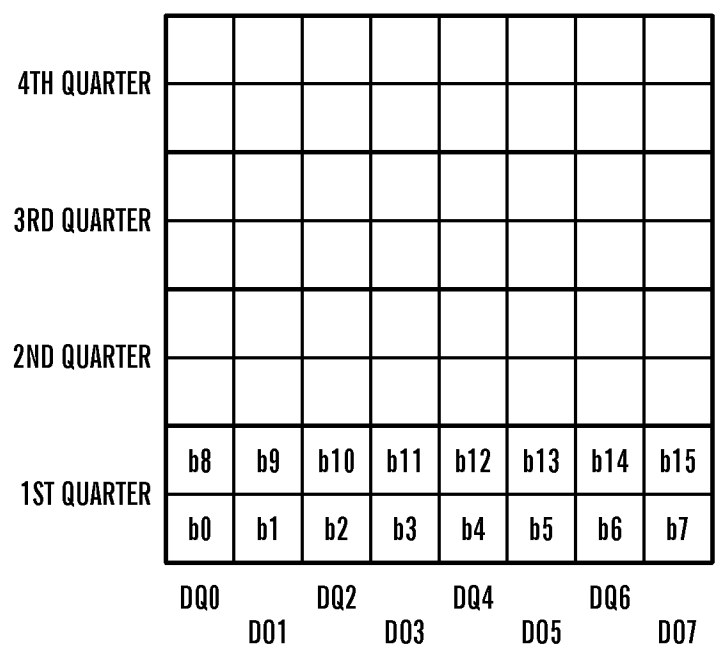

FIG. 9 depicts an error control code symbol definition (DDR3 device) according to an embodiment. The 16 bit symbol depicted in FIG. 9 is received over two DDR3 transfers. The RAIM code is applied four times across the burst of 8 in the DRAM, each processing 64 bytes worth of data for a total of 256 bytes.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As described above, embodiments can be embodied in the form of computer-implemented processes and apparatuses for practicing those processes. In exemplary embodiments, the invention is embodied in computer program code executed by one or more network elements. Embodiments include a computer program product on a computer usable medium with computer program code logic containing instructions embodied in tangible media as an article of manufacture. Exemplary articles of manufacture for computer usable medium may include floppy diskettes, CD-ROMs, hard drives, universal serial bus (USB) flash drives, or any other computer-readable storage medium, wherein, when the computer program code logic is loaded into and executed by a computer, the computer becomes an apparatus for practicing the invention. Embodiments include computer program code logic, for example, whether stored in a storage medium, loaded into and/or executed by a computer, or transmitted over some transmission medium, such as over electrical wiring or cabling, through fiber optics, or via electromagnetic radiation, wherein, when the computer program code logic is loaded into and executed by a computer, the computer becomes an apparatus for practicing the invention. When implemented on a general-purpose microprocessor, the computer program code logic segments configure the microprocessor to create specific logic circuits.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer implemented method comprising:
    receiving data including error correction code (ECC) bits, the receiving from a plurality of channels, each channel comprising a plurality of memory devices at memory device locations;
    computing syndromes of the data;
    receiving a channel identifier of one of the channels;
    removing a contribution of data received on the channel from the computed syndromes, the removing resulting in channel adjusted syndromes; and
    decoding the channel adjusted syndromes, the decoding resulting in channel adjusted memory device locations of failing memory devices, the channel adjusted memory device locations corresponding to memory device locations.

2. The method of claim 1, further comprising:
    performing an exclusive or (XOR) of contents of channels not corresponding to the channel identifier and storing results of the XOR into the channel; and
    for each channel adjusted memory device location:
        translating the channel adjusted memory device location into two of the memory device locations; and
        applying a correction to the two memory device locations.

3. The method of claim 1, further comprising:
    for each channel adjusted memory device location:
        translating the channel adjusted memory device location into one of the memory device locations; and
        applying a correction to the one memory device location; and
    performing an XOR of contents of channels not corresponding to the channel identifier and storing results of the XOR into the channel.

4. The method of claim 1, wherein the channel is a failing channel.

5. The method of claim 1, wherein the channel is not a failing channel.

6. The method of claim 1, further comprising:
    receiving a memory device identifier of at least one of the memory devices; and
    removing a contribution of data received on the at least one memory device from the computed syndromes prior to the decoding.

7. The method of claim 1, wherein input to the decoding includes a parity matrix with elements equal to a memory device location raised to a power of two.

8. The method of claim 7, wherein the memory device locations correspond to columns of another parity check matrix of a Reed-Solomon code.

9. The method of claim 1, wherein addresses of memory device locations in one channel are computed by multiplying the addresses of memory device locations in another channel by a constant.

10. The method of claim 1, wherein the channel adjusted syndromes are computed in parallel for every possible channel location, and wherein the received channel identifier selects which channel adjusted syndrome to select.

11. A system comprising:
a plurality of channels, each channel comprising a plurality of memory devices at memory device locations;
a decoder in communication with the channels, the decoder configured for performing a method comprising:
receiving data including error correction code (ECC) bits, the receiving from the channels;
computing syndromes of the data;
receiving a channel identifier of one of the channels;
removing a contribution of data received on the channel from the computed syndromes, the removing resulting in channel adjusted syndromes; and
decoding the channel adjusted syndromes, the decoding resulting in channel adjusted memory device locations of failing memory devices, the channel adjusted memory device locations corresponding to memory device locations.

12. The system of claim 11, further comprising:
performing an exclusive or (XOR) of contents of channels not corresponding to the channel identifier and storing results of the XOR into the channel; and
for each channel adjusted memory device location:
translating the channel adjusted memory device location into two of the memory device locations; and
applying a correction to the two memory device locations.

13. The system of claim 11, wherein the method further comprises:
for each channel adjusted memory device location:
translating the channel adjusted memory device location into one of the memory device locations; and
applying a correction to the one memory device location; and
performing an XOR of contents of channels not corresponding to the channel identifier and storing results of the XOR into the channel.

14. The system of claim 11, wherein the channel is a failing channel.

15. The system of claim 11, wherein the channel is not a failing channel.

16. The system of claim 11, wherein the method further comprises:
receiving a memory device identifier of at least one of the memory devices; and
removing a contribution of data received on the at least one memory device from the computed syndromes prior to the decoding.

17. The system of claim 11, wherein input to the decoding includes a parity matrix with elements equal to a memory device location raised to a power of two.

18. The system of claim 11, wherein the memory device locations correspond to columns of another parity check matrix of a Reed-Solomon code.

19. The system of claim 11, wherein addresses of memory device locations in one channel are computed by multiplying the addresses of memory device locations in another channel by a constant.

20. The system of claim 11, wherein the channel adjusted syndromes are computed in parallel for every possible channel location, and wherein the received channel identifier selects which channel adjusted syndrome to select.

21. A computer program product comprising a tangible storage medium readable by a processing circuit and storing instructions for execution by the processing circuit for performing a method comprising:
receiving data including error correction code (ECC) bits, the receiving from a plurality of channels, each channel comprising a plurality of memory devices at memory device locations;
computing syndromes of the data;
receiving a channel identifier of one of the channels;
removing a contribution of data received on the channel from the computed syndromes, the removing resulting in channel adjusted syndromes; and
decoding the channel adjusted syndromes, the decoding resulting in channel adjusted memory device locations of failing memory devices, the channel adjusted memory device locations corresponding to memory device locations.

* * * * *